(12) United States Patent
Romney

(10) Patent No.: US 9,297,839 B2
(45) Date of Patent: Mar. 29, 2016

(54) AUTOMATIC DETECTION OF EXPANSION COMPONENT IRRIGATION CONTROLLER

(71) Applicant: Skydrop, LLC, Highland, UT (US)

(72) Inventor: Matt Romney, Alpine, UT (US)

(73) Assignee: Skydrop Holdings, LLC, Highland, UT (US)

(*) Notice: Subject to any disclaimer, the term of this patent is extended or adjusted under 35 U.S.C. 154(b) by 78 days.

(21) Appl. No.: 14/321,747

(22) Filed: Jul. 1, 2014

(65) Prior Publication Data

US 2015/0077087 A1 Mar. 19, 2015

Related U.S. Application Data

(63) Continuation-in-part of application No. 14/315,264, filed on Jun. 25, 2014, and a continuation-in-part of application No. 14/315,267, filed on Jun. 25, 2014.

(60) Provisional application No. 61/924,154, filed on Jan. 6, 2014, provisional application No. 61/841,828, filed on Jul. 1, 2013.

(51) Int. Cl.
| | |
|---|---|
| *G01R 19/00* | (2006.01) |
| *G01R 19/165* | (2006.01) |
| *A01G 25/00* | (2006.01) |
| *A01G 25/16* | (2006.01) |
| *G05B 15/02* | (2006.01) |
| *G05B 19/042* | (2006.01) |
| *G05D 11/00* | (2006.01) |

(52) U.S. Cl.
CPC .............. *G01R 19/165* (2013.01); *A01G 25/00* (2013.01); *A01G 25/165* (2013.01); *A01G 25/167* (2013.01); *G01R 19/0092* (2013.01); *G05B 15/02* (2013.01); *G05B 19/0426* (2013.01); *G05B 2219/23406* (2013.01); *G05B 2219/25056* (2013.01); *G05B 2219/25085* (2013.01); *G05B 2219/25103* (2013.01); *G05B 2219/25322* (2013.01); *G05B 2219/2625* (2013.01); *G05B 2219/31422* (2013.01)

(58) Field of Classification Search
CPC ........... G01R 19/0092; G01R 19/0084; G01R 21/00; G01R 21/133; G01R 31/40; A01G 25/16; A01G 25/06; A01G 25/09; A01G 31/00; A01G 9/26; G05B 15/02; G05B 2219/2625
USPC .............................. 324/76.11–76.83; 700/284
See application file for complete search history.

(56) References Cited

U.S. PATENT DOCUMENTS

| | | |
|---|---|---|
| 3,040,458 A | 6/1962 | Mathews |
| 4,165,532 A | 8/1979 | Kendall et al. |
| 5,381,331 A | 1/1995 | Mock et al. |
| 5,479,338 A | 12/1995 | Ericksen et al. |
| 5,956,808 A | 9/1999 | Tom |
| 6,102,061 A | 8/2000 | Addink |
| 6,240,336 B1 | 5/2001 | Brundisini |

(Continued)

*Primary Examiner* — Jermele M Hollington
*Assistant Examiner* — Raul Rios Russo
(74) *Attorney, Agent, or Firm* — Terrence J. Edwards; TechLaw Ventures, PLLC

(57) ABSTRACT

The disclosure extends to apparatuses, methods, systems, and computer program products for generating and optimizing irrigation protocols. The disclosure also extends to a system and method for detecting an expansion module in an irrigation system in accordance with the disclosed methods, systems, and computer program products for optimizing water usage in growing plants for yard and crops.

45 Claims, 25 Drawing Sheets

(56) References Cited

U.S. PATENT DOCUMENTS

| | | | |
|---|---|---|---|
| 6,570,109 B2 | 5/2003 | Klinefelter et al. | |
| 6,823,239 B2 | 11/2004 | Sieminski | |
| 7,010,395 B1 | 3/2006 | Goldberg et al. | |
| 7,049,761 B2 | 5/2006 | Timmermans et al. | |
| 7,225,057 B2 | 5/2007 | Froman et al. | |
| 7,266,281 B1 | 9/2007 | Flatau | |
| 7,386,303 B2 | 6/2008 | Buchholz et al. | |
| 7,778,736 B2 | 8/2010 | Sutardja | |
| 7,899,580 B2 | 3/2011 | Cardinal et al. | |
| 8,193,930 B2 | 6/2012 | Petite et al. | |
| 8,209,061 B2 | 6/2012 | Palmer et al. | |
| 8,251,300 B2 | 8/2012 | Wilson | |
| 8,643,495 B2 | 2/2014 | Lan et al. | |
| 2002/0091452 A1* | 7/2002 | Addink | A01G 25/16 700/19 |
| 2002/0125998 A1 | 9/2002 | Petite et al. | |
| 2003/0093159 A1 | 5/2003 | Sieminski | |
| 2003/0160107 A1 | 8/2003 | Harris | |
| 2003/0179102 A1 | 9/2003 | Barnes | |
| 2005/0267641 A1* | 12/2005 | Nickerson | A01G 25/16 700/284 |
| 2005/0273205 A1 | 12/2005 | Nickerson et al. | |
| 2006/0116791 A1 | 6/2006 | Ravula et al. | |
| 2007/0088462 A1 | 4/2007 | Peleg | |
| 2007/0152983 A1 | 7/2007 | McKillop et al. | |
| 2009/0099701 A1 | 4/2009 | Li et al. | |
| 2009/0216345 A1 | 8/2009 | Christfort | |
| 2009/0281672 A1 | 11/2009 | Pourzia | |
| 2010/0038440 A1 | 2/2010 | Ersavas | |
| 2010/0179701 A1 | 7/2010 | Gilbert et al. | |
| 2010/0181174 A1 | 7/2010 | Larson et al. | |
| 2010/0268392 A1 | 10/2010 | Korol et al. | |
| 2010/0289652 A1 | 11/2010 | Javey et al. | |
| 2011/0040415 A1 | 2/2011 | Nickerson et al. | |
| 2011/0170239 A1 | 7/2011 | Nelson et al. | |
| 2011/0270448 A1 | 11/2011 | Kantor et al. | |
| 2012/0041606 A1 | 2/2012 | Standerfer et al. | |
| 2012/0089259 A1 | 4/2012 | Williams et al. | |
| 2012/0221154 A1 | 8/2012 | Runge | |
| 2012/0239211 A1 | 9/2012 | Walker et al. | |
| 2012/0303168 A1 | 11/2012 | Halahan et al. | |
| 2013/0060389 A1 | 3/2013 | Marsters et al. | |
| 2013/0085619 A1 | 4/2013 | Howard | |
| 2013/0099022 A9 | 4/2013 | Palmer et al. | |
| 2013/0131874 A1 | 5/2013 | Shupe et al. | |
| 2013/0158724 A1* | 6/2013 | Nickerson | A01G 25/16 700/284 |
| 2013/0226357 A1 | 8/2013 | Ersavas et al. | |
| 2014/0039696 A1 | 2/2014 | Andrews | |
| 2014/0039697 A1 | 2/2014 | Weiler et al. | |
| 2015/0032273 A1 | 1/2015 | Romney et al. | |
| 2015/0073607 A1 | 3/2015 | Endrizzi et al. | |
| 2015/0075259 A1 | 3/2015 | Romney et al. | |
| 2015/0081111 A1 | 3/2015 | Endrizzi et al. | |
| 2015/0081112 A1 | 3/2015 | Endrizzi et al. | |
| 2015/0081113 A1 | 3/2015 | Endrizzi et al. | |
| 2015/0081114 A1 | 3/2015 | Romney et al. | |
| 2015/0081117 A1 | 3/2015 | Romney et al. | |

* cited by examiner

AUTOMATIC DETECTION OF EXPANSION COMPONENT IRRIGATION CONTROLLER

CROSS-REFERENCE TO RELATED APPLICATIONS

This application claims the benefit of U.S. Provisional Patent Application No. 61/841,828, filed on Jul. 1, 2013, and U.S. Provisional Patent Application No. 61/924,154, filed on Jan. 6, 2014, which are hereby incorporated by reference herein in their entireties, including but not limited to those portions that specifically appear hereinafter, the incorporation by reference being made with the following exception: In the event that any portion of the above-referenced applications is inconsistent with this application, this application supersedes said above-referenced applications.

This application is a continuation-in-part of co-pending U.S. patent application Ser. No. 14/315,264, filed Jun. 25, 2014, entitled "COMPENSATING FOR MUNICIPAL RESTRICTIONS WITHIN IRRIGATION PROTOCOLS," and this application is also a continuation-in-part of co-pending U.S. patent application Ser. No. 14/315,267, filed Jun. 25, 2014, entitled "BACKUP WATERING INSTRUCTIONS AND IRRIGATION PROTOCOLS WHEN CONNECTION TO A NETWORK IS LOST," which are hereby incorporated by reference herein in their entireties, including but not limited to those portions that specifically appear hereinafter, the incorporation by reference being made with the following exception: In the event that any portion of the above-referenced applications is inconsistent with this application, this application supersedes said portion of said above-referenced applications.

FEDERALLY SPONSORED RESEARCH OR DEVELOPMENT

Not Applicable.

BACKGROUND

With the increased desire for water conservation while maintaining healthy yard and crops, it has become important to use the advances in technology and communication systems to provide efficient use of water resources. Many irrigation systems and irrigation hardware are crude or unduly complicated resulting in the existing systems being used at non-optimal levels.

What is needed are methods, systems, and computer program implemented products for regulating irrigation in areas that are predictable and often over watered because caretakers and/or older irrigations systems are not responsive enough to effectively conserve water while maintaining aesthetically pleasing or healthy landscapes. The disclosure addresses the above needs by providing methods, systems, and computer program implemented products for regulating the use of water over a computer network by generating irrigation protocols and sending those protocols over the computer network.

BRIEF DESCRIPTION OF THE DRAWINGS

Non-limiting and non-exhaustive implementations of the disclosure are described with reference to the following figures, wherein like reference numerals refer to like parts throughout the various views unless otherwise specified. Advantages of the disclosure will become better understood with regard to the following description and accompanying drawings where.

DETAILED DESCRIPTION

The disclosure extends to apparatuses, methods, systems, and computer program products for optimizing water usage in growing plants for yard and crops. The disclosure also extends to apparatuses, methods, systems, and computer program implemented products for regulating the use of water over a computer network by generating irrigation protocols and sending those protocols over the computer network. The disclosure discloses embodiments and implementation of improved control units optimizing water use and additional environmental conditions. In the following description of the disclosure, reference is made to the accompanying drawings, which form a part hereof, and in which is shown by way of illustration specific implementations in which the disclosure may be practiced. It is to be understood that other implementations may be utilized and structural changes may be made without departing from the scope of the disclosure.

It will be appreciated that the disclosure also extends to methods, systems, and computer program products for smart watering utilizing up-to-date weather data, interpreting that weather data, and using that interpreted weather data to send irrigation protocols with computer implemented instructions to a controller. The controller may be electronically and directly connected to a plumbing system that may have at least one electronically actuated control valve for controlling the flow of water through the plumbing system, where the controller may be configured for sending actuation signals to the at least one control valve thereby controlling water flow through the plumbing system in an efficient and elegant manner to effectively conserve water while maintaining aesthetically pleasing or healthy landscapes.

As used herein, the terms environment and environmental is used to denote influence-able areas and conditions that can be adjusted by operable components of a system. For example, a landscape environment can be optimally irrigated or lit with operable components of corresponding systems such as sprinkler systems and lighting systems.

Figure 1:
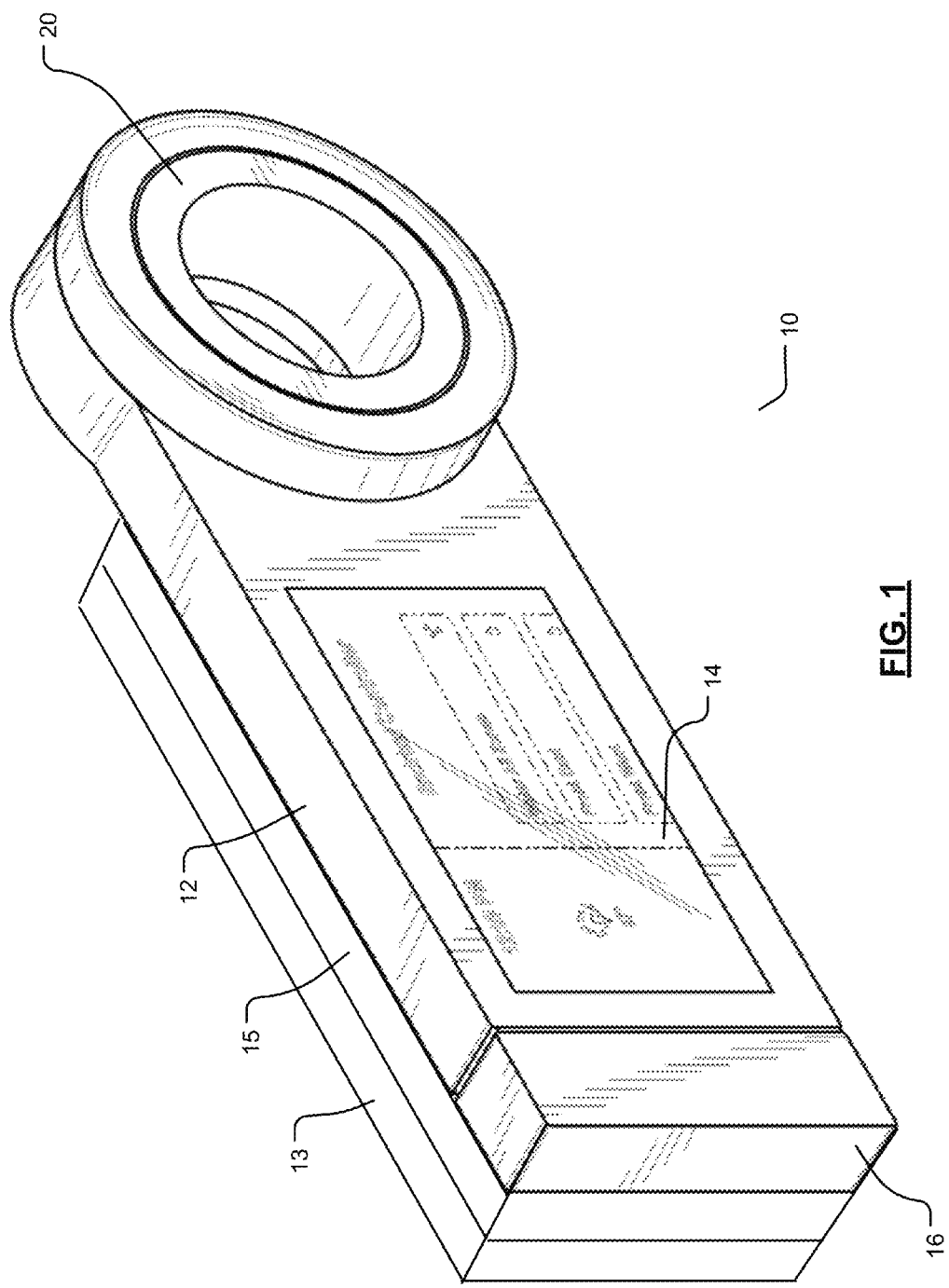
FIG. 1 illustrates an embodiment of a control unit in accordance with the teachings and principles of the disclosure.

FIG. 1 illustrates and embodiment of an irrigation controller, also referred to sometimes as a control unit, that may be used within a system for executing irrigation protocols by causing operable irrigation components to actuate in accordance to the irrigation protocol. As can be seen in the figure, a control unit 10 may comprise a housing 12 and a user input 20. In an implementation the user input may have a generally circular or annular form factor that is easily manipulated by a user to input data and to provide responses to queries. As will be discussed in more detail below, the user input may provide/receive a plurality of input movements, such as for example, rotation, speed of rotation, push and click, click duration, double click, and the like. The control unit 10 may further comprise an electronic visual display 14, either digital or analog, for visually outputting information to a user. As illustrated in the figure, an embodiment may comprise a stackable configuration wherein the control unit 12 is configured to be stacked on to the irrigation adaptor 13 such that the control unit electronic connector of the control unit mates with a corresponding electronic connector of the irrigation adaptor Additionally, it should be noted that an embodiment may comprise a plurality of visual outputs, and other components of the control unit 10, such as the user input 20 may be configured to output visual information. Analog visual outputs may be provided by components such as bulbs and the like. Digital visual outputs may be provided by components such as, liquid crystal displays, light emitting diodes, electroluminescent devices, to name a few. In an embodiment, the control unit 10 may further comprise an electronic audible device 16, either digital or analog, for audibly outputting information to a user. Additionally, it should be noted that an embodiment may comprise a plurality of audible outputs, and other components of the control unit 10 may be configured to output audible information. Analog audible outputs may be provided by components such as speakers, mechanical clicks, etc. Digital audible outputs may be provided by components such as, piezo-electric circuits and speakers. It should also be appreciated that the housing 12 may be configured to be substantially weather resistant such that it can be installed and used outdoors. It will be appreciated that the controller 10 may be electronically and directly connected to a plumbing system, such as an irrigation sprinkler system, that may have at least one electronically actuated control valve for controlling the flow of water through the plumbing system. Additionally, the controller 10 may be configured for sending actuation signals to the at least one control valve thereby controlling water flow through the plumbing system in an efficient and elegant manner to effectively conserve water while maintaining aesthetically pleasing or healthy landscapes. It should be understood that in an implementation, the controller 10 may further comprise memory for recording irrigation iteration data for a plurality of iterations after a plurality of irrigation protocols have been executed. In an implementation, the controller 10 of a system and method may further record irrigation iteration data into memory in case communication with an irrigation server is interrupted.

Figure 2:
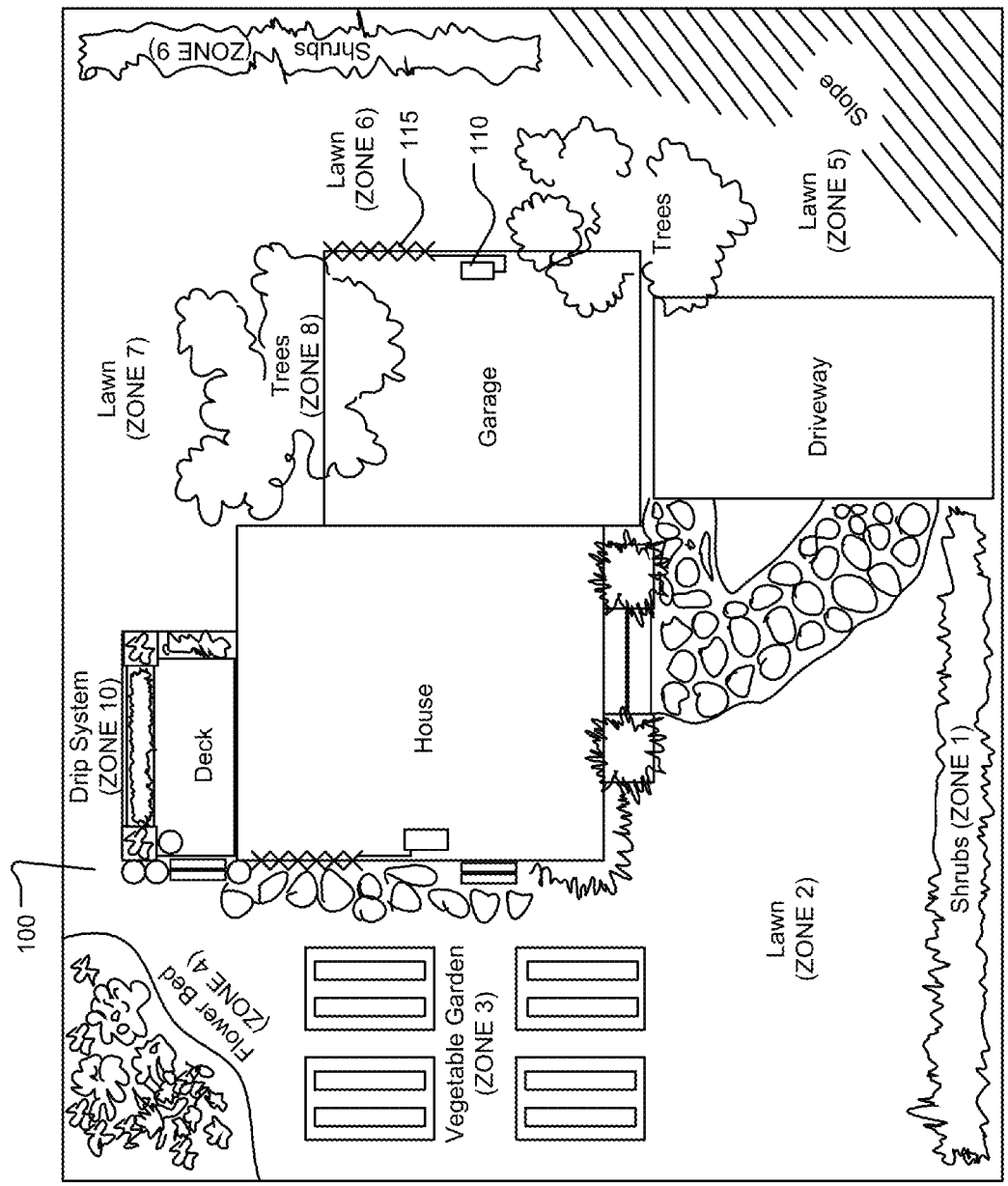
FIG. 2 illustrates an overhead view of a landscaped yard surrounding a house with a zoned irrigation system in accordance with the teachings and principles of the disclosure.

FIG. 2 illustrates an overhead view of a landscaped yard surrounding a house. As can be seen in the figure, the yard has been divided into a plurality of zones. For example, the figure is illustrated as having ten zones, but it will be appreciated that any number of zones may be implemented by the disclosure. It will be appreciated that the number of zones may be determined based on a number of factors, including soil type, plant type, slope type, area to be irrigated, etc. which will help determine the duration that needed for each zone. It will be appreciated that the controller and its zonal capacity may determine the number of zones that may be irrigated. For example, a controller may have a capacity of eight, meaning that the controller can optimize eight zones (i.e., Zone 1-Zone 8). However, it will be appreciated that any zonal capacity may be utilized by the disclosure.

In an implementation, each zone may have different watering needs. Each zone may be associated with a certain control valve 115 that allows water into the plumbing that services each area, which corresponds to each zone. As can be seen in the figure, a zone may be a lawn area, a garden area, a tree area, a flower bed area, a shrub area, another plant type area, or any combination of the above. It will be appreciated that zones may be designated using various factors. In an implementation, zones may be designated by the amount of shade an area gets. In an implementation, zones may be defined according to soil type, amount of slope present, plant or crop type and the like. In some implementations, one or more zones may comprise drip systems, or one or more sprinkler systems, thereby providing alternative methods of delivering water to a zone.

It will be appreciated, as illustrated in FIG. 2, that a landscape may have a complex mix of zones or zone types, with each zone having separate watering needs. Many current watering systems employ a controller 110 for controlling the timing of the opening and closing of the valves within the plumbing system, such that each zone may be watered separately. These controllers 110 or control systems usually run on low voltage platforms and control solenoid type valves that are either completely open or completely closed by the actuation from a control signal. Often control systems may have a timing device to aid in the water intervals and watering times. Controllers have remained relatively simple, but as disclosed herein below in more detail, more sophisticated controllers or systems will provide optimization of the amount of water used through networked connectivity and user interaction as initiated by the system.

Figure 3:
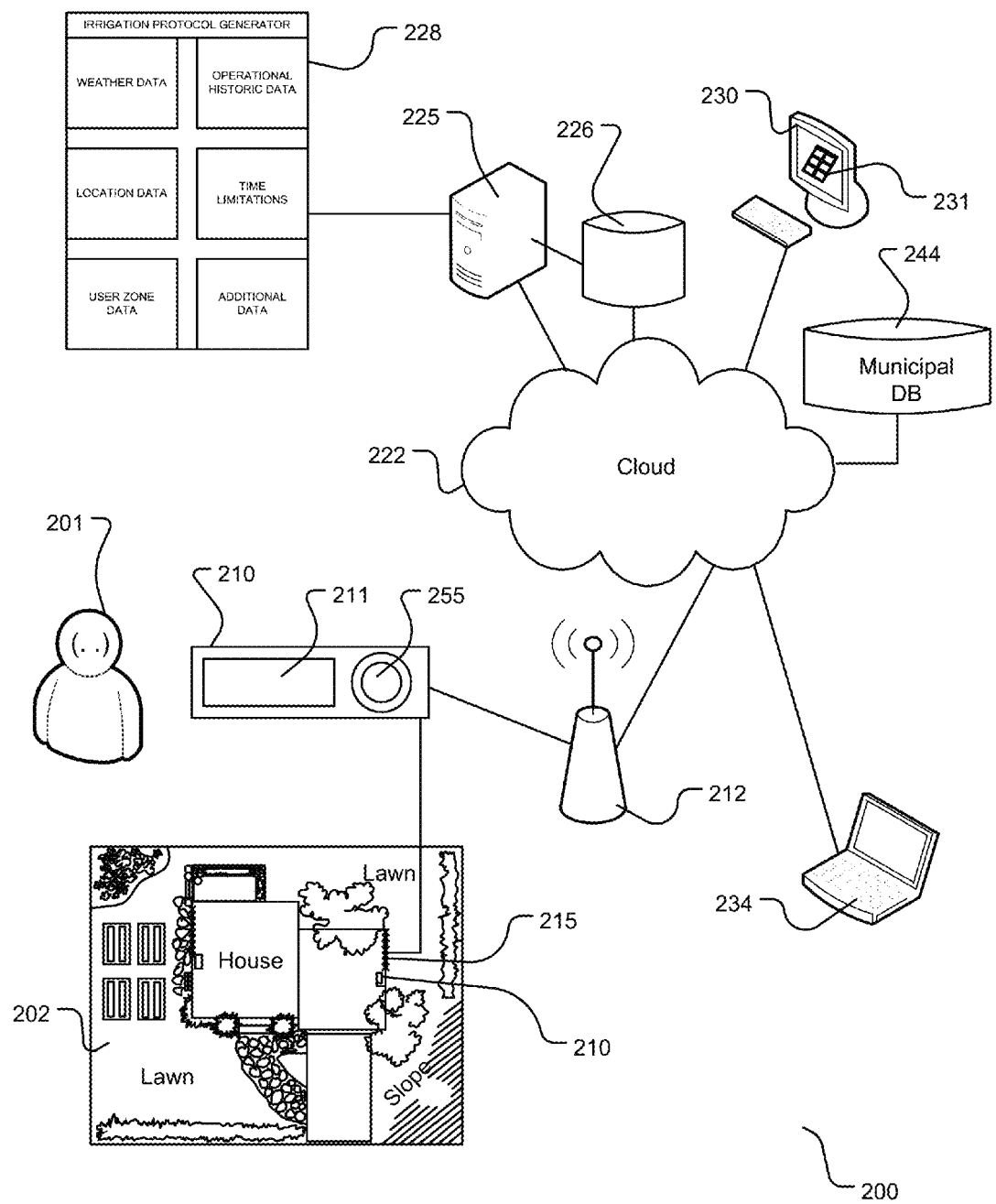
FIG. 3 illustrates a schematic diagram of an optimized irrigation control system that communicates over network in accordance with the teachings and principles of the disclosure.

FIG. 3 illustrates a schematic diagram of an optimized irrigation control system 200 that communicates over network in order to benefit from user entered and crowd sourced irrigation related data stored and accessed from a database 226. As illustrated in the figure, a system 200 for providing automated irrigation may comprise a plumbing system, such as a sprinkler system (all elements are not shown specifically, but the system is conceptualized in landscape 200), having at least one electronically actuated control valve 215. The system 200 may also comprise a controller 210 that may be electronically connected to or in electronic communication with the control valve 215. The controller 210 may have a display 211 or control panel and an input 255 for providing information to and receiving information from the user. The controller 210 may comprise a display or a user interface 211 for allowing a user to enter commands that control the operation of the plumbing system. The system 200 may also comprise a network interface 212 that may be in electronic communication with the controller 210. The network interface 212 may provide network 222 access to the controller 210. The system 200 may further comprise an irrigation protocol server 225 providing a web based user interface 231 on a display or computer 230. The system 200 may comprise a database 226 that may comprise data such as weather data, location data, user data, operational historical data, and other data that may be used in optimizing an irrigation protocol from an irrigation protocol generator 228.

The system 200 may further comprise a rule/protocol generator 228 using data from a plurality of databases for generating an irrigation protocol, wherein the generation of an irrigation protocol is initiated in part in response to at least an input by a user. It should be noted that the network 222 mentioned above could be a cloud-computing network, and/or the Internet, and/or part of a closed/private network without departing from the scope of the disclosure.

In an implementation, access may be granted to third party service providers through worker terminals 234 that may connect to the system through the network 222. The service providers may be granted pro-status on the system and may be shown more options through a user interface because of their knowledge and experience, for example, in landscaping, plumbing, and/or other experience. In an implementation, worker terminals may be a portable computing device such as portable computer, tablet, smart phone, PDA, and/or the like.

An additional feature of the system 200 may be to provide notices or notifications to users of changes that impact their irrigation protocol. For example, an implementation may provide notice to a home owner/user that its professional lawn service has made changes through a worker terminal 234. An implementation may provide a user the ability to ratify changes made by others or to reject any changes.

In an implementation, an irrigation system 200 may comprise a plurality of control valves 215, wherein each control valve corresponds to a zone of irrigation.

In an implementation, user communication may be facilitated through a mobile application on a mobile device configured for communicating with the irrigation protocol server 225. One or more notifications may be provided as push notifications to provide real time responsiveness from the users to the system 200.

The system 200 may further comprise an interval timer for controlling the timing of when the notifications are sent to users or customers, such that users/customers are contacted at useful intervals. For example, the system 200 may initiate contact with a user after predetermined interval of time has passed for the modifications to the irrigation protocol to take effect in the landscape, for example in plants, shrubs, grass, trees and other landscape.

In an implementation, the notifications may ask the user to provide information or indicia regarding such things as: soil type of a zone, crop type of a zone, irrigation start time, time intervals during which irrigation is occurring, the condition of each zone, or other types of information or objective indicia.

Figure 4:
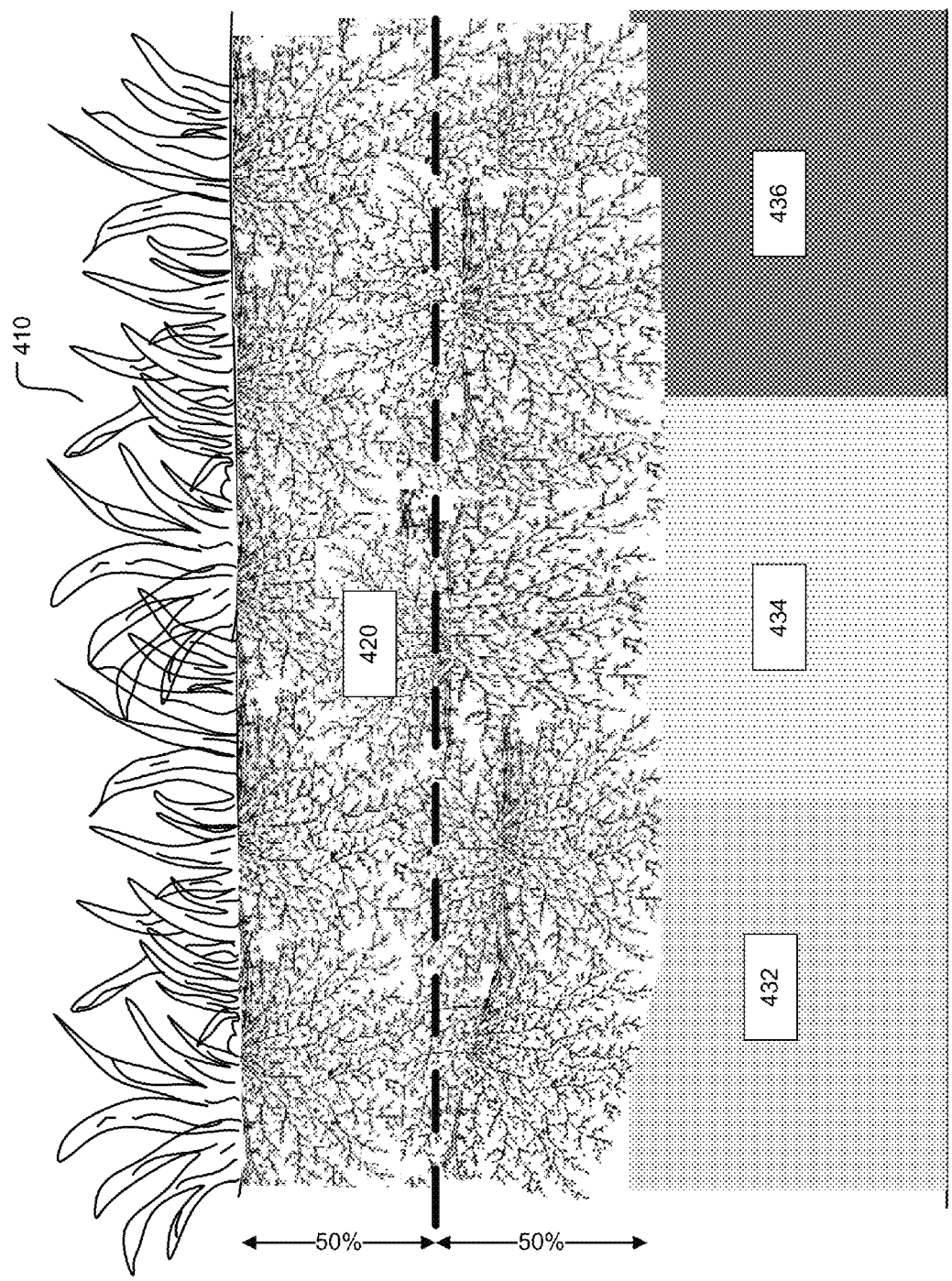
FIG. 4 illustrates a schematic diagram of a crop root zone that will be optimally watered by an irrigation system in accordance with the teachings and principles of the disclosure.

Illustrated in FIG. 4 is an exemplary crop (grass) root zone showing roots in various soil types. Referring to FIG. 4, it will be appreciated that the optimization of the irrigation and plumbing system is to provide the requisite water needed to maintain a healthy landscape and no more. Thus, the general understanding is that the amount of water that is lost during evapotranspiration per zone must be replenished at each irrigation start and run time. It will be appreciated that evapotranspiration is the amount of water lost from the sum of transpiration and evaporation. The U.S. Geological Survey defines evapotranspiration as water lost to the atmosphere from the ground surface, evaporation from the capillary fringe of the groundwater table, and the transpiration of groundwater by plants whose roots tap the capillary fringe of the groundwater table. Evapotranspiration may be defined as loss of water from the soil both by evaporation from the soil surface and by transpiration from the leaves of the plants growing on it. It will be appreciated and understood that factors that affect the rate of evapotranspiration include the amount of solar radiation, atmospheric vapor pressure, temperature, wind, and soil moisture. Evapotranspiration accounts for most of the water lost from the soil during the growth of a plant or crop. Accurately estimating evapotranspiration rates is an advantageous factor in not only planning irrigation schemes, but also in formulating irrigation protocols to be executed by a controller to efficiently use water resources.

Illustrated in FIG. 4 is an example of grass 410 and its root zone 420. Also illustrated is an example of the various soil types that may be present per zone, such as clay 432, silt 434, or sand 436, etc. It will be appreciated that the landscape may be considered healthy and water use and conservation may be considered optimal, when the irrigation and plumbing system function or operate to replenish the water in the root zone 420 when water is present at about 50% in the root zone 420. Thus, when water is present in the root zone 420 in an amount greater than about 50% then the duration of the watering for that zone is shortened. Conversely, when water is present in the root zone 420 in an amount less than about 50% then the duration of the watering for that zone is increased. The objective is to replenish the soil with water in the root zone 420 to 100% and no more to optimize and conserve the amount the water used to maintain a healthy landscape. It will be appreciated that any amount of water over 100% saturation in the root zone 420 leads to water runoff that is not efficiently used. Thus, it will be appreciated that the ability to accurately determine the amount of water present in the soil may be advantageous for optimizing irrigation in an irrigation system.

Figure 5:
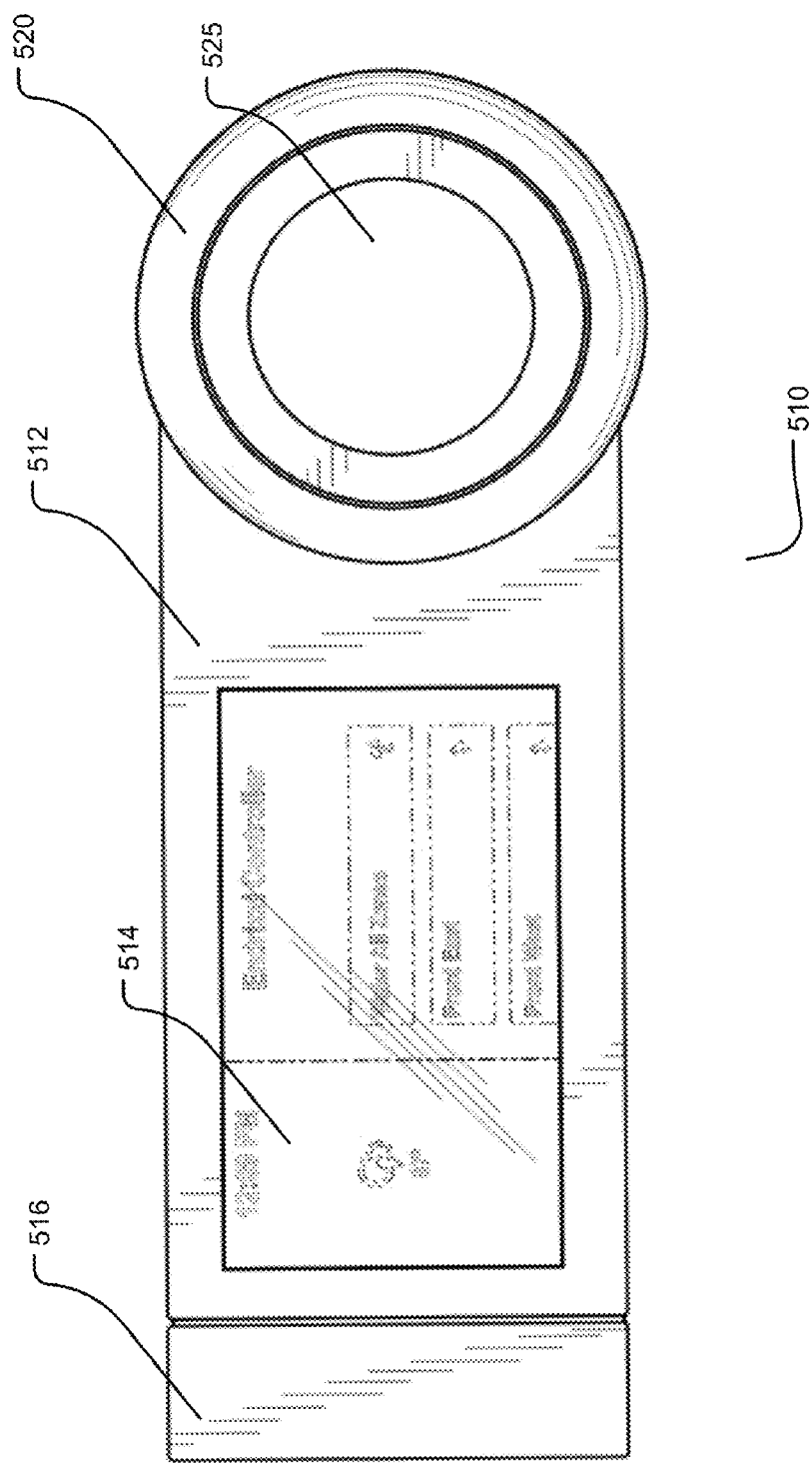
FIG. 5 illustrates a front view of an embodiment of a control unit in accordance with the teachings and principles of the disclosure.
Figure 6:
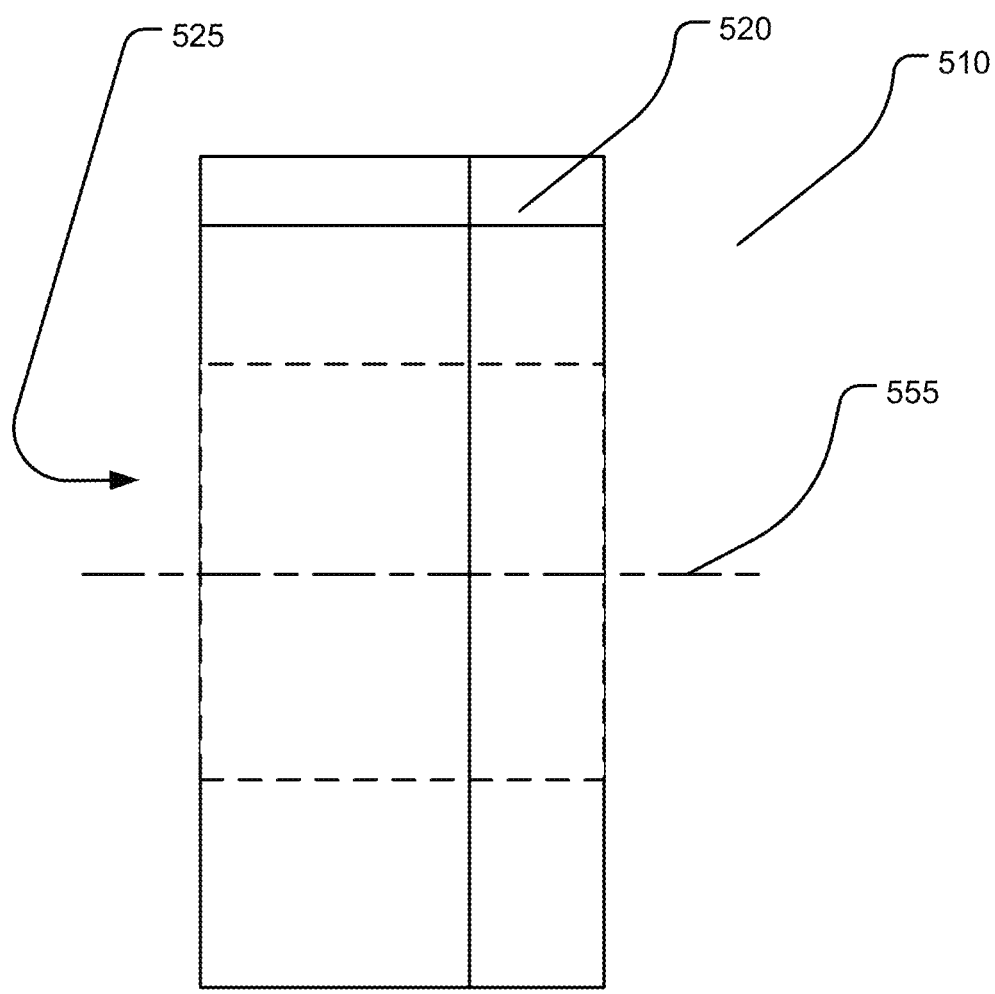
FIG. 6 illustrates a phantom line first side view of an embodiment of a control unit in accordance with the teachings and principles of the disclosure.

FIG. 5 illustrates a front view of a controller having an annular user input having an opening that extends through the entire width of the controller (or control unit portion). As can be seen in the figure, a control unit 510 may comprise a housing 512 and a user input 520. In an implementation of the user input 520 may have a generally circular or annular form factor that is easily manipulated by a user to input data and to provide responses to queries. During use the user input 520 may revolve around an axis such that a user may rotate the dial to quickly enter large data ranges of values by simply spinning the dial. In an embodiment the user input 510 have a cylindrical hole/opening 525 that is coaxial with axis of rotation of the user input as illustrated in FIG. 6. In an embodiment the user input 520 may be illuminated such that the opening 525 glows in an attractive and oft informative manner such that the illumination patterns could be employed to convey the status of the system. The user input 520 may be configured to correspond with the display 514 such that manipulation of the user input causes corresponding changes in the display 514. The user input 520 may provide/receive a plurality of input movements, such as for example, rotation, speed of rotation, push and click, click duration, double click, and the like.

The control unit 510 may further comprise an electronic visual display 514, either digital or analog, for visually outputting information to a user. Additionally, it should be noted that an embodiment may comprise a plurality of visual outputs, and other components of the control unit 510, such as the user input 520 may be configured to output visual information. Analog visual outputs may be provided by components such as bulbs and the like. Digital visual outputs may be provided by components such as, liquid crystal displays, light emitting diodes, electro-luminescent devices, to name a few. In an embodiment, the control unit 510 may further comprise an electronic audible device 516, either digital or analog, for audibly outputting information to a user. Additionally, it should be noted that an embodiment may comprise a plurality of audible outputs, and other components of the control unit 510 may be configured to output audible information. Analog audible outputs may be provided by components such as speakers, mechanical clicks, etc. Digital audible outputs may be provided by components such as, piezo-electric circuits and speakers. It should also be appreciated that the housing 12 may be configured to be substantially weather resistant such that it can be installed and used outdoors. It will be appreciated that the controller 510 may be electronically and directly connected to a plumbing system, such as an irrigation sprinkler system, that may have at least one electronically actuated control valve for controlling the flow of water through the plumbing system. Additionally, the controller 510 may be configured for sending actuation signals to the at least one control valve thereby controlling water flow through the plumbing system in an efficient and elegant manner to effectively conserve water while maintaining aesthetically pleasing or healthy landscapes. It should be understood that in an implementation, the controller 510 may further comprise memory for recording irrigation iteration data for a plurality of iterations after a plurality of irrigation protocols have been executed. In an implementation, the controller 510 of a system and method may further record irrigation iteration data into memory in case communication with an irrigation server is interrupted.

FIG. 6 illustrates a first side view of a controller 510 showing the coaxial relationship of the axis of rotation of the annular user input 520 with the opening 520. As can be seen in the figure, an axis of rotation 555 corresponding to the annular user input 520 is coaxial with the cylindrical opening 525 that is illustrated with phantom lines. It will be appreciated that the opening may have an opening that is not cylindrical in shape. Whatever shape is chosen for the opening may have an axis of rotation such that it can be aligned with the axis of rotation of the user input.

Figure 7:
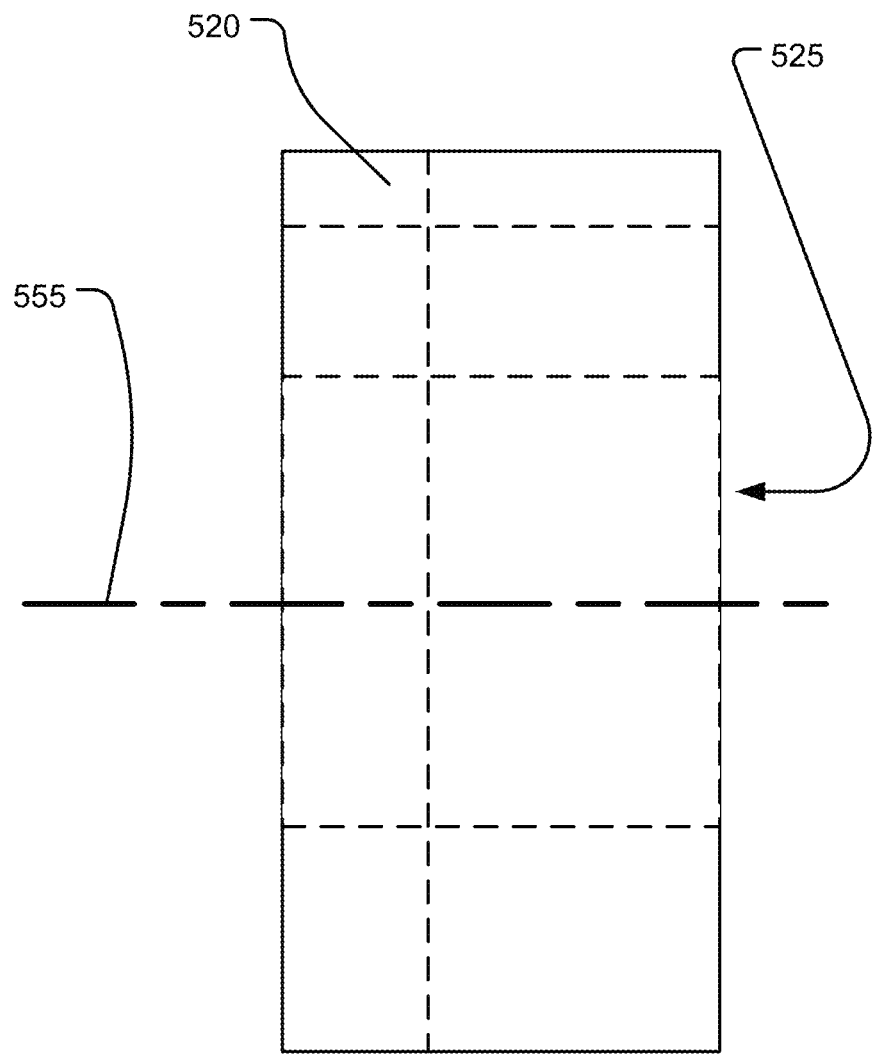
FIG. 7 a phantom line second side view of an embodiment of a control unit in accordance with the teachings and principles of the disclosure.

FIG. 7 illustrates a second side view of a controller also illustrating from the opposite side the axis 555 of rotation of the user input 520 is coaxial with the axis of the cylindrical opening 525.

Figure 8:
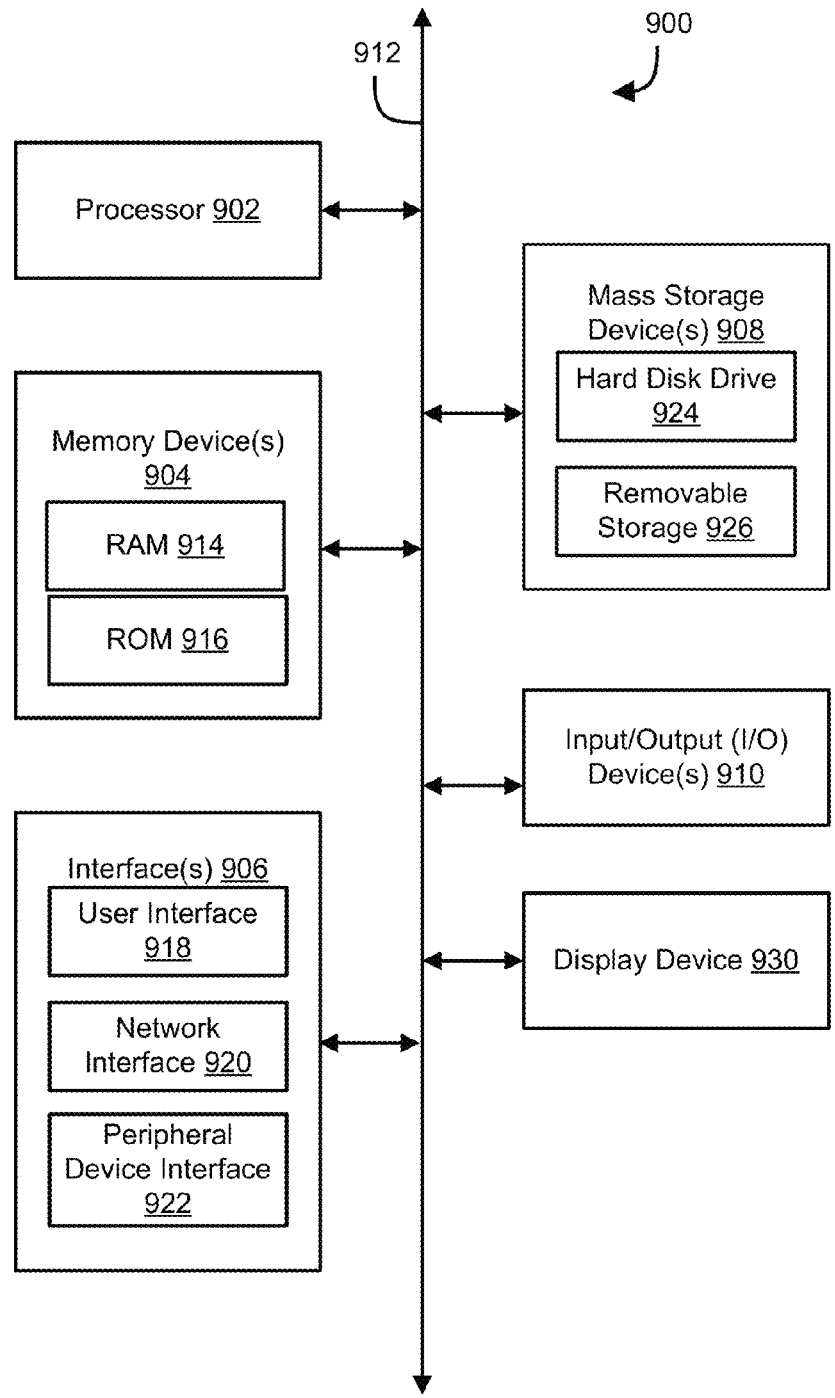
FIG. 8 illustrates a block diagram of an example computing device in accordance with the teachings and principles of the disclosure.

FIG. 8 It will be appreciated that implementations of the disclosure may comprise or utilize a special purpose or general-purpose computer, including computer hardware, such as, for example, one or more processors and system memory as discussed in greater detail below. Implementations within the scope of the disclosure also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the disclosure can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmission media can include a network and/or data links, which can be used to carry desired program code means in the form of computer-executable instructions or data structures and which can be accessed by a general purpose or special purpose computer. Combinations of the above should also be included within the scope of computer-readable media.

Further, upon reaching various computer system components, program code means in the form of computer-executable instructions or data structures can be transferred automatically from transmission media to computer storage media (devices) (or vice-versa). For example, computer-executable instructions or data structures received over a network or data link can be buffered in RAM within a network interface module (e.g., a "NIC"), and then eventually transferred to computer system RAM and/or to less volatile computer storage media (devices) at a computer system. RAM can also include solid-state drives (SSDs or PCIx based real time memory tiered storage, such as FusionIO). Thus, it should be understood that computer storage media (devices) can be included in computer system components that also (or even primarily) utilize transmission media.

Computer-executable instructions comprise, for example, instructions and data, which, when executed at a processor, cause a general purpose computer, special purpose computer, or special purpose processing device to perform a certain function or group of functions. The computer executable instructions may be, for example, binaries, intermediate format instructions such as assembly language, or even source code.

Those skilled in the art will appreciate that the disclosure may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, various storage devices, commodity hardware, commodity computers, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Implementations of the disclosure can also be used in cloud computing environments. In this description and the following claims, "cloud computing" is defined as a model for enabling ubiquitous, convenient, on-demand network access to a shared pool of configurable computing resources (e.g., networks, servers, storage, applications, and services) that can be rapidly provisioned via virtualization and released with minimal management effort or service provider interaction, and then scaled accordingly. A cloud model can be composed of various characteristics (e.g., on-demand self-service, broad network access, resource pooling, rapid elasticity, measured service, or any suitable characteristic now known to those of ordinary skill in the field, or later discovered), service models (e.g., Software as a Service (SaaS), Platform as a Service (PaaS), Infrastructure as a Service (IaaS)), and deployment models (e.g., private cloud, community cloud, public cloud, hybrid cloud, or any suitable service type model now known to those of ordinary skill in the field, or later discovered). Databases and servers described with respect to the disclosure can be included in a cloud model.

Further, where appropriate, functions described herein can be performed in one or more of: hardware, software, firmware, digital components, or analog components. For example, one or more application specific integrated circuits (ASICs) can be programmed to carry out one or more of the systems and procedures described herein. Certain terms are used throughout the following description and claims to refer to particular system components. As one skilled in the art will appreciate, components may be referred to by different names. This document does not intend to distinguish between components that differ in name, but not function.

Referring now to FIG. 8, a block diagram of an example computing device 900 such as a controller/control unit is illustrated. Computing device 900 may be used to perform various procedures, such as those discussed herein. Computing device 900 can function as a server, a client, or any other computing entity. Computing device 900 can perform various monitoring functions as discussed herein, and can execute one or more application programs, such as the application programs described herein. Computing device 900 can be any of a wide variety of computing devices, such as a desktop computer, a notebook computer, a server computer, a handheld computer, tablet computer and the like.

Computing device 900 includes one or more processor(s) 902, one or more memory device(s) 904, one or more interface(s) 906, one or more mass storage device(s) 908, one or more Input/Output (I/O) device(s) 910, and a display device 930 all of which are coupled to a bus 912. Processor(s) 902 include one or more processors or controllers that execute instructions stored in memory device(s) 904 and/or mass storage device(s) 908. Processor(s) 902 may also include various types of computer-readable media, such as cache memory.

Memory device(s) 904 include various computer-readable media, such as volatile memory (e.g., random access memory (RAM) 914) and/or nonvolatile memory (e.g., read-only memory (ROM) 916). Memory device(s) 904 may also include rewritable ROM, such as Flash memory.

Mass storage device(s) 908 include various computer readable media, such as magnetic tapes, magnetic disks, optical disks, solid-state memory (e.g., Flash memory), and so forth. As shown in FIG. 8, a particular mass storage device is a hard disk drive 924. Various drives may also be included in mass storage device(s) 908 to enable reading from and/or writing to the various computer readable media. Mass storage device(s) 908 include removable media 926 and/or non-removable media.

I/O device(s) 910 include various devices that allow data and/or other information to be input to or retrieved from computing device 900. Example I/O device(s) 910 include cursor control devices, keyboards, keypads, microphones, monitors or other display devices, speakers, printers, network interface cards, modems, annular jog dials, and the like.

Display device 930 includes any type of device capable of displaying information to one or more users of computing device 900. Examples of display device 930 include a monitor, display terminal, video projection device, and the like.

Interface(s) 906 include various interfaces that allow computing device 900 to interact with other systems, devices, or computing environments. Example interface(s) 906 may include any number of different network interfaces 920, such as interfaces to local area networks (LANs), wide area networks (WANs), wireless networks, and the Internet. Other interface(s) include user interface 918 and peripheral device interface 922. The interface(s) 906 may also include one or more user interface elements 918. The interface(s) 906 may also include one or more peripheral interfaces such as interfaces for printers, pointing devices (mice, track pad, or any suitable user interface now known to those of ordinary skill in the field, or later discovered), keyboards, and the like.

Additionally, Bus 912 may allow sensors 911 to communicate with other computing components. Sensors may alternatively communicate through other components, such as I/O devices and various peripheral interfaces.

Bus 912 allows processor(s) 902, memory device(s) 904, interface(s) 906, mass storage device(s) 908, and I/O device(s) 910 to communicate with one another, as well as other devices or components coupled to bus 912. Bus 912 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 900, and are executed by processor(s) 902. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 9:
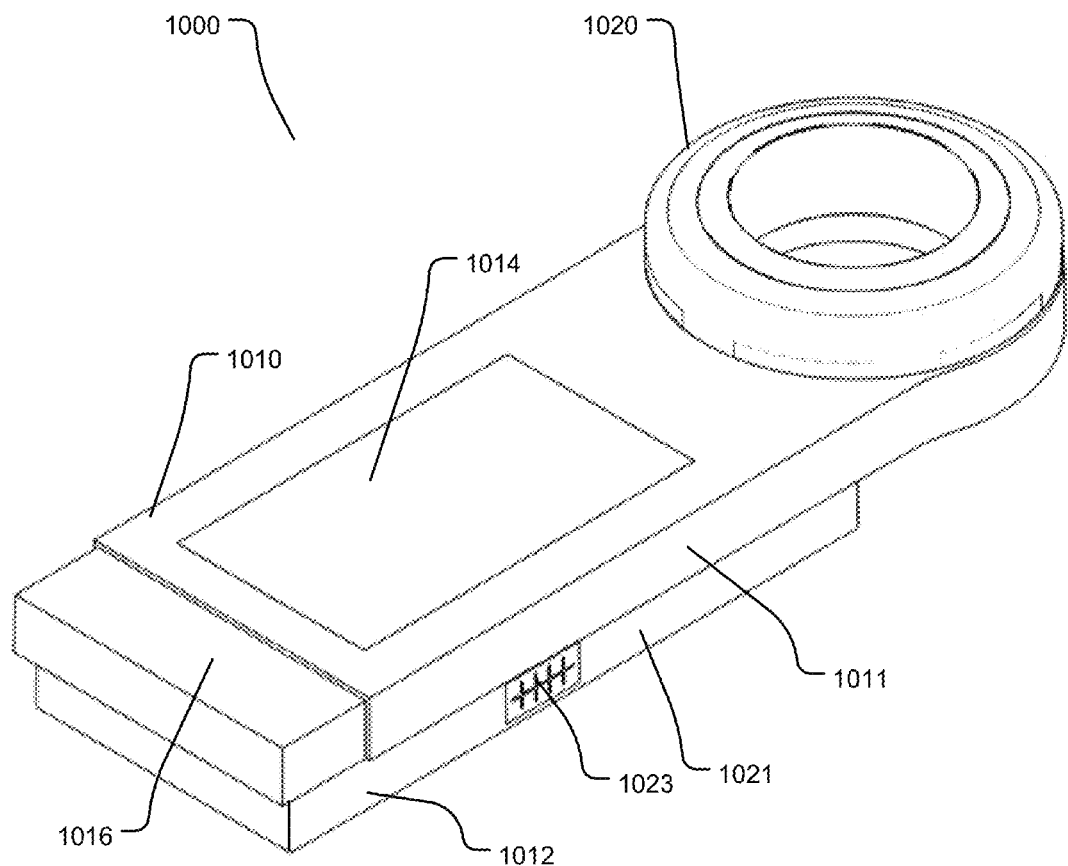
FIG. 9 illustrates an embodiment of a control unit and adaptor in accordance with the teachings and principles of the disclosure.

FIG. 9 illustrates an embodiment of a controller that comprises a control unit portion and an irrigation adaptor portion. In an embodiment, the controller may comprise a plurality of portions wherein the control unit 1011 is configured to be stacked on to the irrigation adaptor 1012 such that the control unit electronic connector (not shown) of the control unit mates with a corresponding electronic connector (shown in FIGS. 10 and 11) of the irrigation adaptor.

As illustrated, the current embodiment of a controller 1000 may comprise a control unit 1010 for interfacing with users and networks, and an irrigation adaptor 1012 for electronically actuating irrigation components. As discussed above, a control unit 1010 may comprise a housing 1011 and a user input 1020. In an implementation the user input may have a generally circular or annular form factor that is easily manipulated by a user to input data and to provide responses to queries. As will be discussed in more detail below, the user input may provide/receive a plurality of input movements, such as for example, rotation, speed of rotation, push and click, click duration, double click, and the like. The control unit 1010 may further comprise an electronic visual display 1014, either digital or analog, for visually outputting information to a user. Additionally, it should be noted that an embodiment may comprise a plurality of visual outputs, and other components of the control unit 1010, such as the user input 1020 may be configured to output visual information. Analog visual outputs may be provided by components such as bulbs and the like. Digital visual outputs may be provided by components such as, liquid crystal displays, light emitting diodes, electro-luminescent devices, to name a few. In an embodiment, the control unit 1010 may further comprise an electronic audible device 1016, either digital or analog, for audibly outputting information to a user. Additionally, it should be noted that an embodiment may comprise a plurality of audible outputs, and other components of the control unit 1010 may be configured to output audible information. Analog audible outputs may be provided by components such as speakers, mechanical clicks, etc. Digital audible outputs may be provided by components such as, piezo-electric circuits and speakers. It should also be appreciated that the housing 1011 may be configured to be substantially weather resistant such that it can be installed and used outdoors. It will be appreciated that the controller 1010 may be electronically and directly connected to a plumbing system, such as an irrigation sprinkler system, that may have at least one electronically actuated control valve for controlling the flow of water through the plumbing system. Additionally, the control unit 1010 may be configured for sending actuation signals to the at least one control valve thereby controlling water flow through the plumbing system in an efficient and elegant manner to effectively conserve water while maintaining aesthetically pleasing or healthy landscapes. It should be understood that in an implementation, the controller 1010 may further comprise memory for recording irrigation iteration data for a plurality of iterations after a plurality of irrigation protocols have been executed. In an implementation, the controller 1010 of a system and method may further record irrigation iteration data into memory in case communication with an irrigation server is interrupted.

In the present embodiment, the control unit 1010 may communicate with the adaptor 1012 through and electronic connector in a stacked configuration. As can be seen in the figure, adaptor 1012 may comprise an adaptor housing 1021 for protecting inside components. Electronic access to internal components of the adaptor 1012 may be provided by a wire access port 1023 whereby wire may carry electric actuation signals from the adaptor to operable components of an irrigation system, such as solenoids through the housing (as illustrated further in FIG. 13).

In an embodiment, an irrigation adaptor may comprise analog audible outputs may be provided by components such as speakers, mechanical clicks, etc. Digital audible outputs may be provided by components such as, piezo-electric circuits and speakers. It should also be appreciated that the housing 1011 may be configured to be substantially weather resistant such that it can be installed and used outdoors.

In an embodiment, an irrigation adaptor may comprise wireless communication interfaces for communication with other components such as, sprinklers, drippers, control units, and servers.

Figure 10:
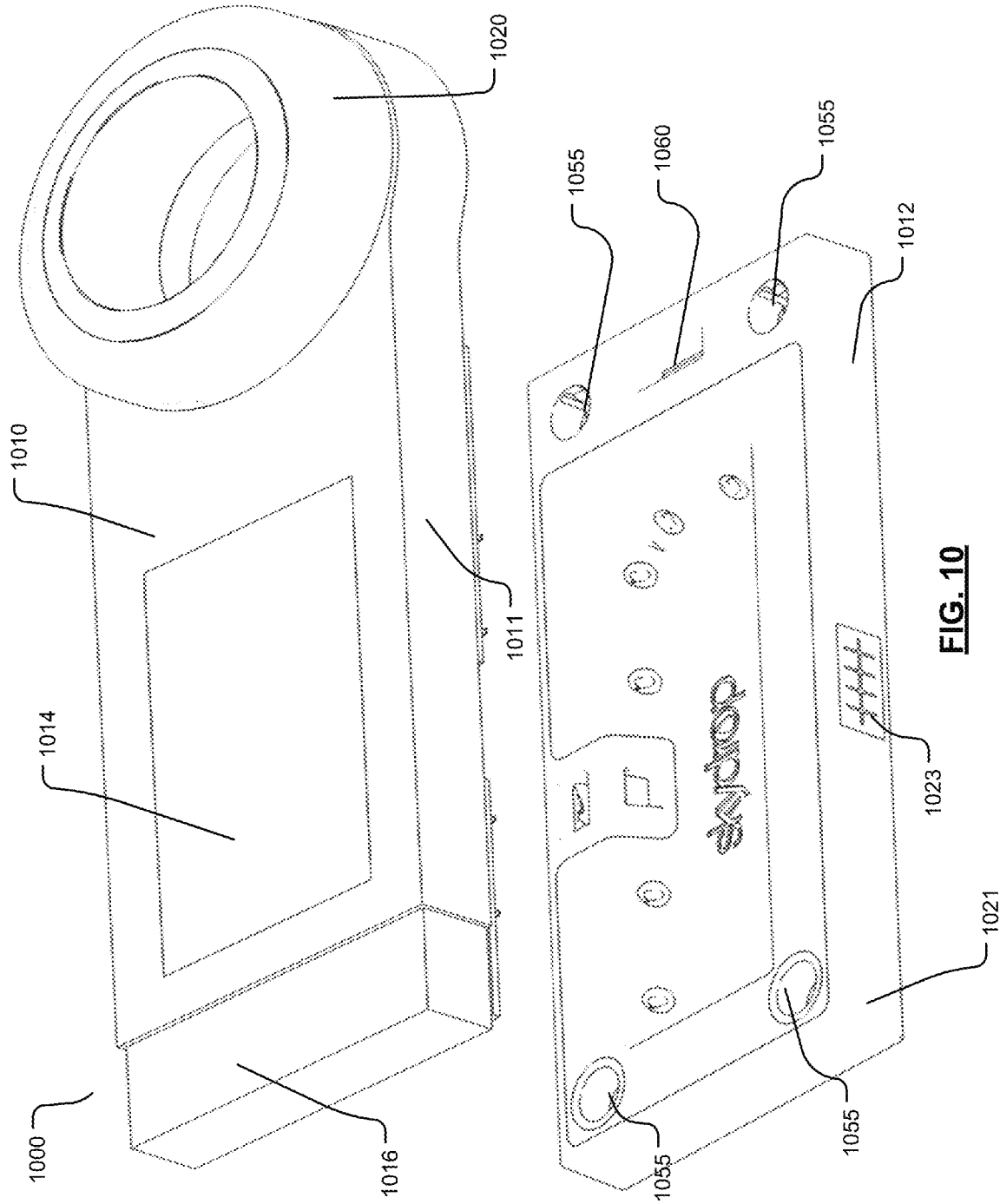
FIG. 10 illustrates a separated view of a control unit and adaptor in accordance with the teachings and principles of the disclosure.

FIG. 10 illustrates an embodiment wherein the adaptor 1012 and control unit 1010 are configured to be stacked such the back side of the control unit mates with the front side of the adaptor 1012. In an implementation, a back side of the adaptor 1012 may be mounted to a substantially vertical surface, such as a wall, and wired to operable components of an irrigation system, such as solenoids. In furtherance of the stacked configuration, the back side of a control unit 1010 may be mated with the front side of the adaptor 1012, both mechanically and electrically to complete to complete the controller 1000 in a stacked configuration. Accordingly, it should be noted that in such a configuration the control unit 1010 is mounted to the vertical surface via the adaptor 1012.

Figure 11:
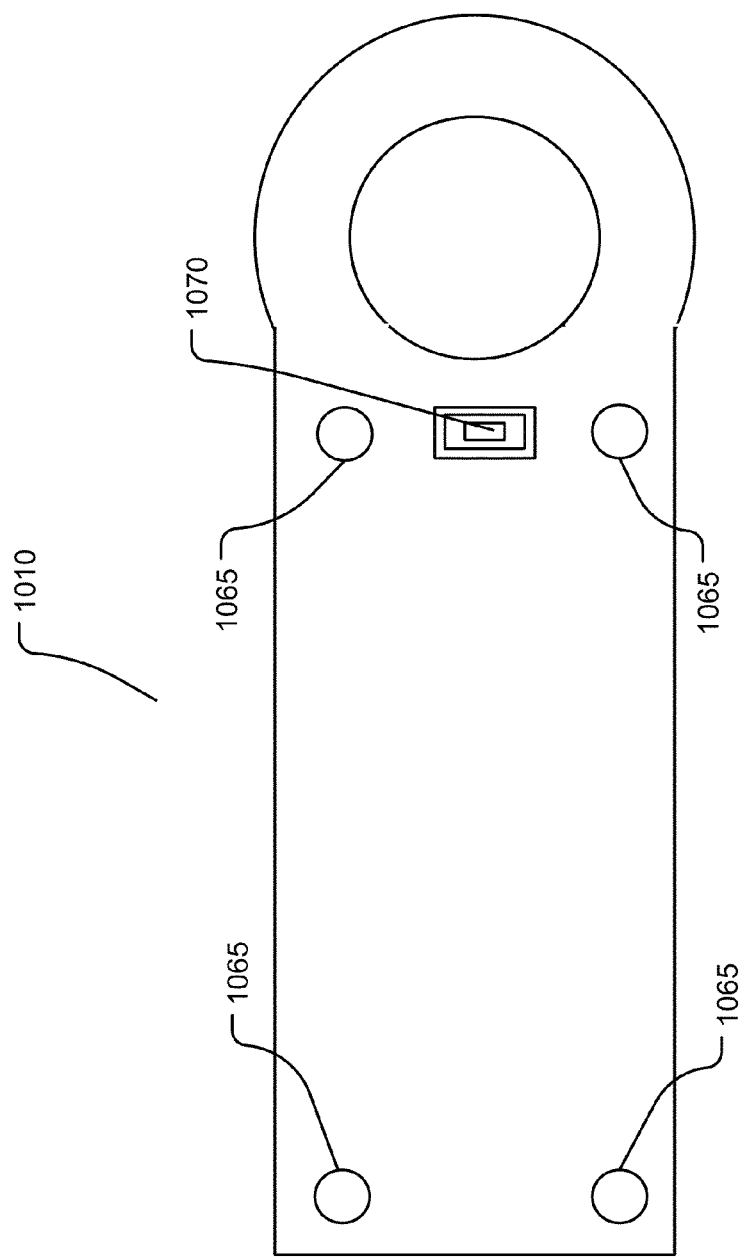
FIG. 11 illustrates a rear view of an implementation of a control unit in accordance with the teachings and principles of the disclosure.

As can be seen in FIGS. 10 and 11, an embodiment of the adaptor 1012 may comprise attachment structures 1055 that correspond to complimentary control unit attachment structures 1065 (of FIG. 11). The attachments may be configured with known or yet to be discovered attachment structures such as protrusions, male-female structures, and common fasteners. For example, the attachment structures may comprise male and female portions that interact and mate mechanically in a detachable manner allowing for expansion of the system and maintenance. Magnets may be used for physically connecting a control unit to an adaptor. Other examples could be all manner of fasteners such as screws, bolts, nails, and the like.

Additionally, in an embodiment the control unit 1010 is in electronic communication with the irrigation adaptor 1012 through an electronic connector. As can be seen in the figures the adaptor 1012 may comprise a first half of an electronic connector 1060 while the control unit 1010 comprises a corresponding second half of an electronic connector 1070. In a stacked embodiment, for example, the attachment structures 1055, 1065 may be configured so as to cause the alignment of the first and second halves of the electronic connectors 1060, 1070. Connector combinations may include male and female, biased compression, and friction configurations to provide secure electronic communications. For example, the control unit 1010 may comprise a male electronic connector 1070 (as shown in FIG. 11) that corresponds with a female electronic connector 1060 (as best shown in FIG. 10).

It should be appreciated that in some embodiments the irrigation adaptor and the control unit may communicate wirelessly with each other.

Figure 12:
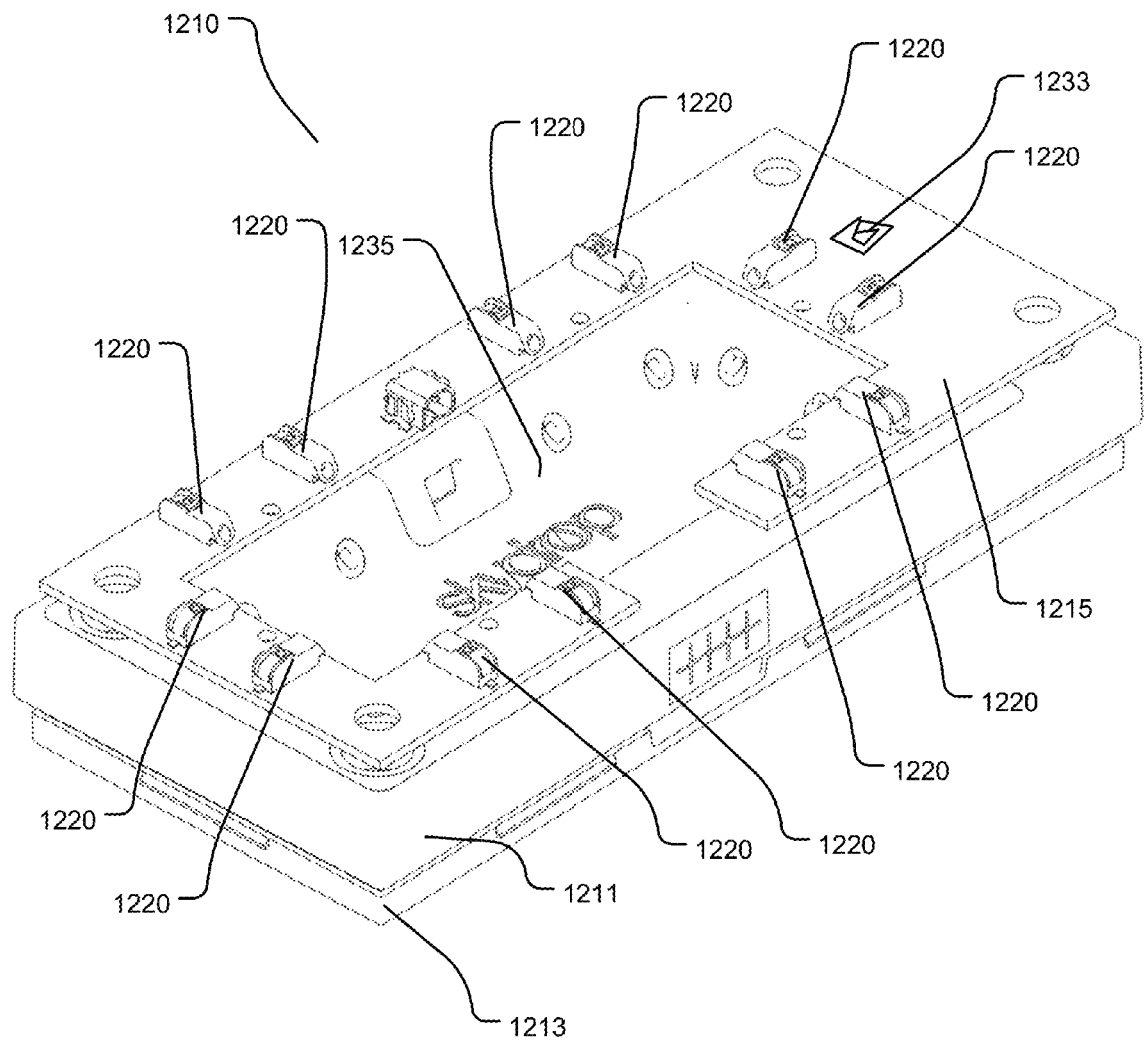
FIG. 12 illustrates a separated view of an implementation of an adaptor in accordance with the teachings and principles of the disclosure.

FIG. 12 illustrates an exploded view of an embodiment of an irrigation adaptor in greater detail for use a corresponding control unit. It should be understood that in some implementations an irrigation adaptor may replace an already installed standard sprinkler controller, and as such, the irrigation adaptor will comprise terminals and powering control similar to the sprinkler controller it replaces. Additionally, an irrigation adaptor may also be referred to as a wall unit as it may typically be mounted to a wall upon installation. As can be seen in the figure, an irrigation adaptor 1210 may comprise a housing 1211 for substantially inclosing the internal components that may work best when protected from the environment. The housing 1211 may comprise a back plate 1213 configured to aid in inclosing the internal components and may be further configured for mounting to various surfaces. In an embodiment, the irrigation adaptor 1210 may comprise a circuit board 1215 for electronically connecting the electrical components of the adaptor 1210. The circuit board 1215 may comprise a bus like structure for enabling the electronic communication among components connected to the circuit board 1215. The irrigation adaptor 1210 may comprise terminals 1220 for receiving wiring therein. As discussed above, an electronic connector 1233 may be included on the circuit board 1215 so as to provide electronic communication connections between the terminals 1220 and a corresponding control unit (not pictured), thereby providing optimized control of irrigation components that control the flow of water.

As seen in the figure, an embodiment of an irrigation adaptor 1210 may further comprise a membrane layer 1235 for providing weather resistance. It should be understood that the membrane layer may comprise openings therein for allowing wires, mechanical connections, and electrical connections there through. In some embodiments, a plurality of membranes may be used. As can be seen in the figure, a wire port 1240 may comprise a membrane therein to provide some weather resistance where the irrigation system wires (illustrated in FIG. 13) enter the irrigation adaptor 1210.

In an embodiment, an irrigation adaptor may have a wire port on the back surface of the irrigation adaptor housing in order to hide the entry of wires. It will be appreciated that it is within the scope of this disclosure to include ports on any side of the adaptor depending on the immediate needs of the installation.

Figure 13:
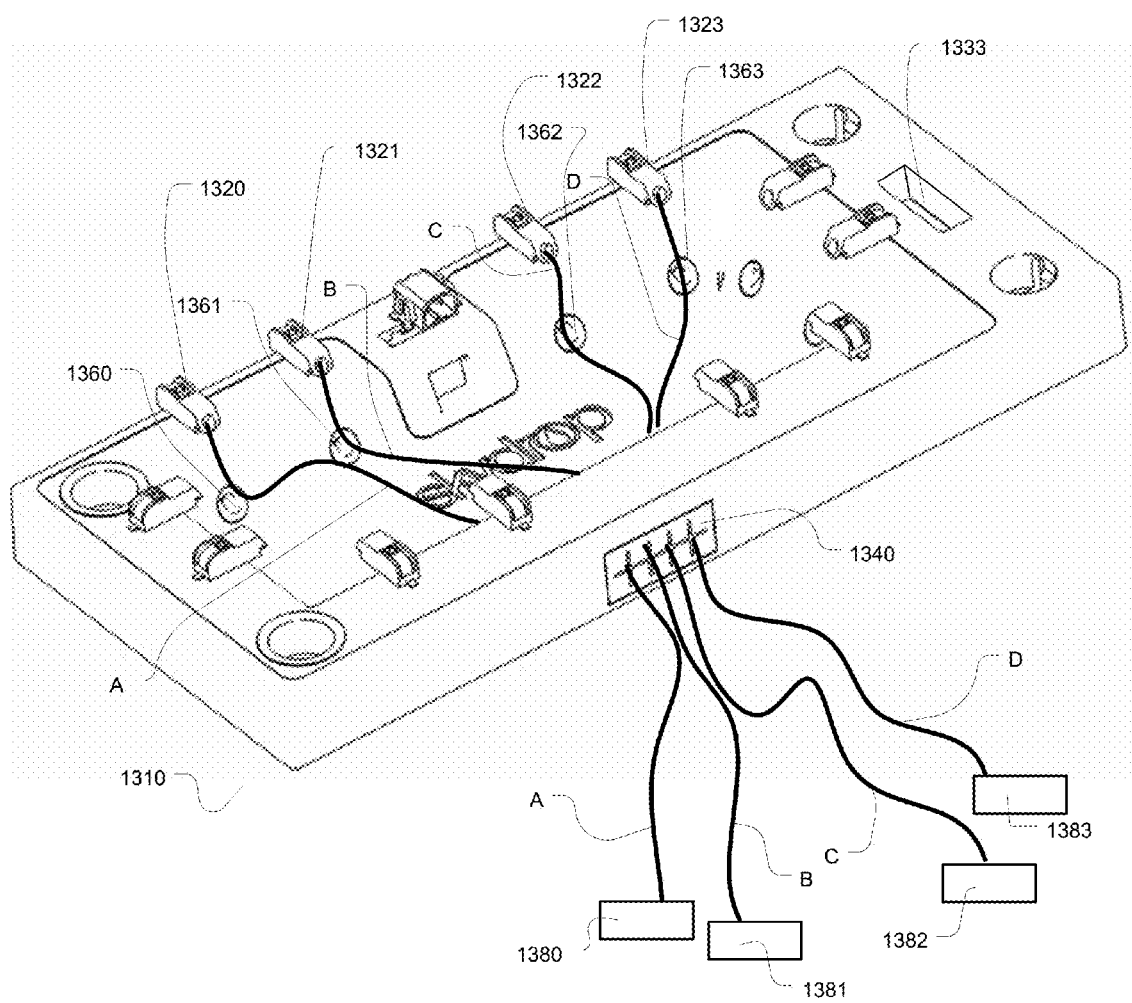
FIG. 13 illustrates a separated view of an implementation of an adaptor wired to components of an irrigation system in accordance with the teachings and principles of the disclosure.

FIG. 13 illustrates one implementation of an irrigation adaptor and its schematic connections to various operational components of an irrigation system. As illustrated in the figure, the irrigation adaptor 1310 may be electronically connected to solenoids within an irrigation system via wires A,B,C,D that connect four solenoids 1380, 1381, 1382, 1383 to the adaptor's terminals 1320, 1321, 1322, 1323 respectively. As can be seen in the figure, the wires A,B,C,D are physically connected at one end to the solenoids 1380, 1381, 1382, 1383, and then pass through wire port 1340, then pass through membrane openings 1360,1361,1362,1363 and finally connect to terminals 1320, 1321, 1322, 1323. In this implementation the terminals 1320, 1321, 1322, 1323 are electrically connected to an electronic connecter 1333 that is configured to correspond to an electronic connector on the back of a control unit. The above discussed connectivity allows a control unit to control components of an irrigation system through an irrigation adaptor 1310.

Figure 14:
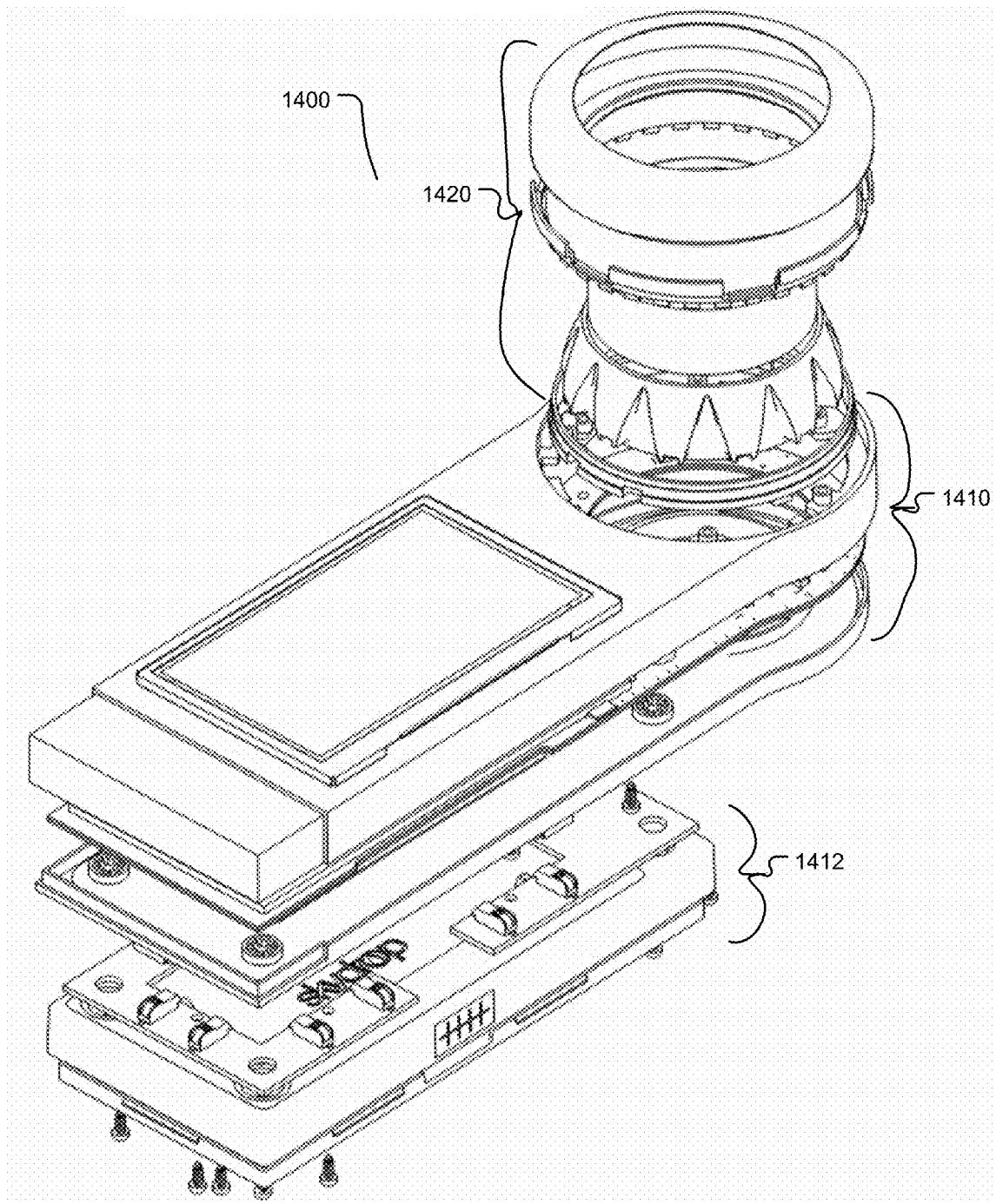
FIG. 14 illustrates an exploded view of an implementation of a controller having an annular user interface in accordance with the teachings and principles of the disclosure.

FIG. 14 illustrates an exploded view implementation of a controller 1400. As can be seen in the figure, the controller 1400 may comprise a control unit 1420, which may comprise a plurality of components, and an irrigation adaptor 1412 that itself comprises a plurality of components. As illustrated, the various components of the control unit 1410 correspond and align with the various components of the irrigation adaptor 1412. Such a configuration allows the controller system to be separated in to self-contained modules that may be stacked and assembled in various configurations to suit various scenarios of use.

Figure 15:
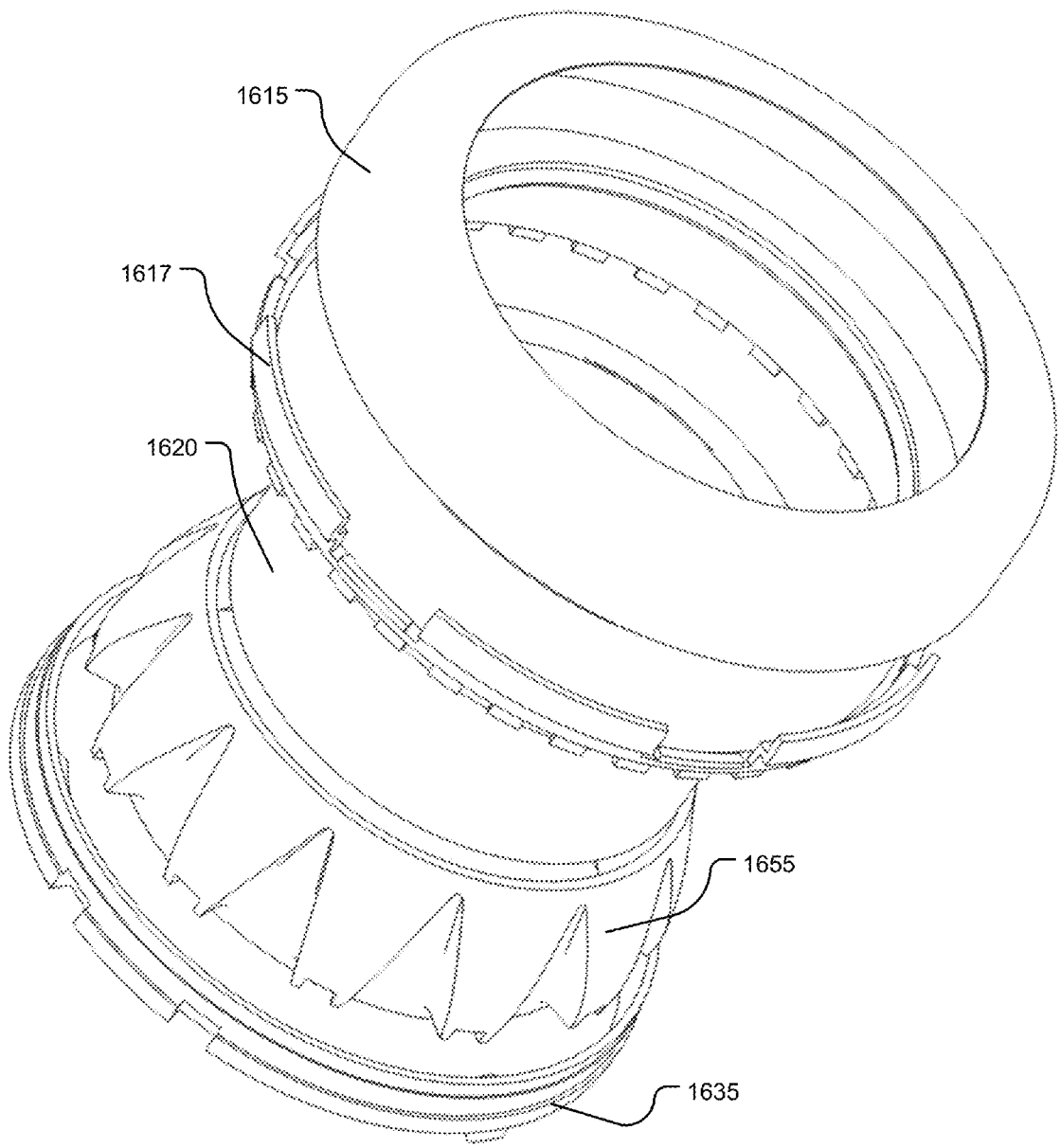
FIG. 15 illustrates an exploded view of an implementation of an annular user interface in accordance with the teachings and principles of the disclosure.

Illustrated in FIG. 15 is an exploded detailed view of a user input 1600. As can be seen in the figure a user input 1600 may comprise a plurality of coaxial aligned components. An implementation may comprise a contact ring 1615 that is configured to be in contact with a user's hand during use. An implementation may further comprise a position ring 1617 that aids in the incremental digitalization of a user's input as discussed below. An embodiment may comprise a light tube 1620 and light diffuser 1655 the work together to transmit and control the quality of illumination from an internal light sources or plurality of light sources. In an embodiment, an annular user input may be configured to interact with a user and the display to receive user input thereby, and wherein the annular user input defines a circular opening that passes through the annular input and the housing; and wherein the annular user input and the circular opening are coaxial such that annular user input rotates about an axis of the circular opening. In use, the opening (1419 of FIG. 14) in the annular user input would allow the illumination from the user input to attractively illuminate the surface that the controller is attached to.

Additionally, the annular user input may further comprise a float ring that is configure to provide consistent movement of the user input and to provide selection protrusions thereon to aid users in making selections with the annular user input 1600 as discussed in more detail below. It will be appreciated that an embodiment may provide a user with the ability to click, double-click, and click-hold in order to select input values.

Figure 16:
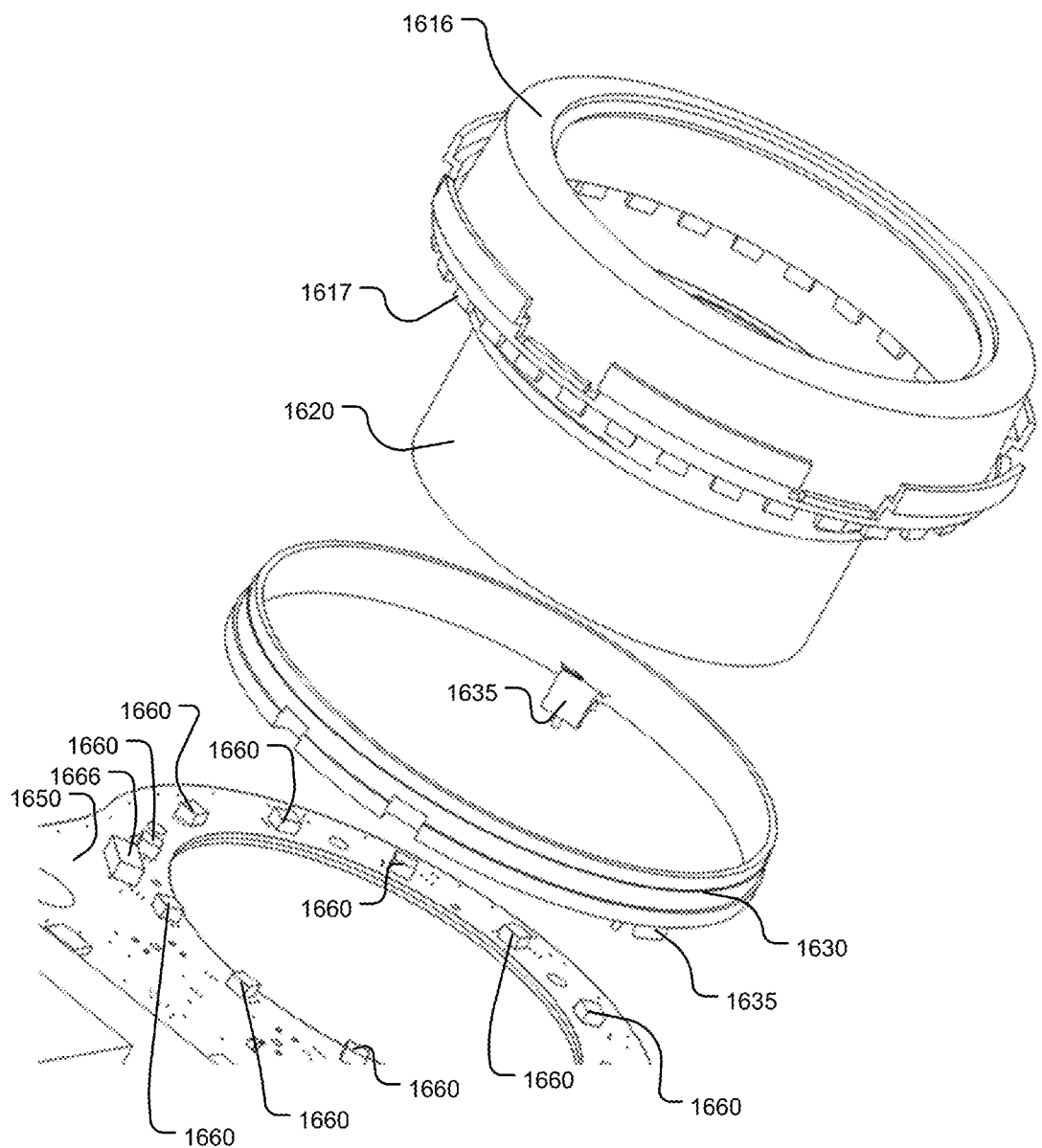
FIG. 16 illustrates an exploded view of an implementation of an annular user interface and supporting circuitry in accordance with the teachings and principles of the disclosure.

Illustrated in FIG. 16 is an exploded view of the working components of an annular user input as it interacts with a circuit board housed within a control unit. The circuit board 1650 may comprise a single substrate supporting a plurality of light emitting diodes and at least one positions sensing circuit. As discussed above, the light emitting diodes 1660 may provide light to the annular user input to provide ease of use and visual cues. The user input may comprise a light tube 1620 for collecting the light of the LEDs 1660. A diffuser ring 1655 may be employed to evenly distribute the light from the LEDs. The user input may comprise a position ring 1616 having a plurality of evenly place protrusions 1617 thereon that correspond to the positions sensor 1666 to detect the rotation of the position ring 1616 in order to digitize a user's desired information for storage in computer memory within the system (illustrated in further detail in FIG. 17). The user input may also comprise a float ring 1630 that provides smooth and consistent operation of the user input by producing predictable friction and even spacing during operation. Additionally, the float ring 1630 may comprise selection protrusions 1635 thereon for actuating receptors on the circuit board 1650 when a user pushes the user input to make a selection. It should be appreciated that a float ring 1630 may comprise a plurality of selection protrusions 1635 in order to provide consistent selection operation throughout the entire circumference of the annular user input.

Figure 17:
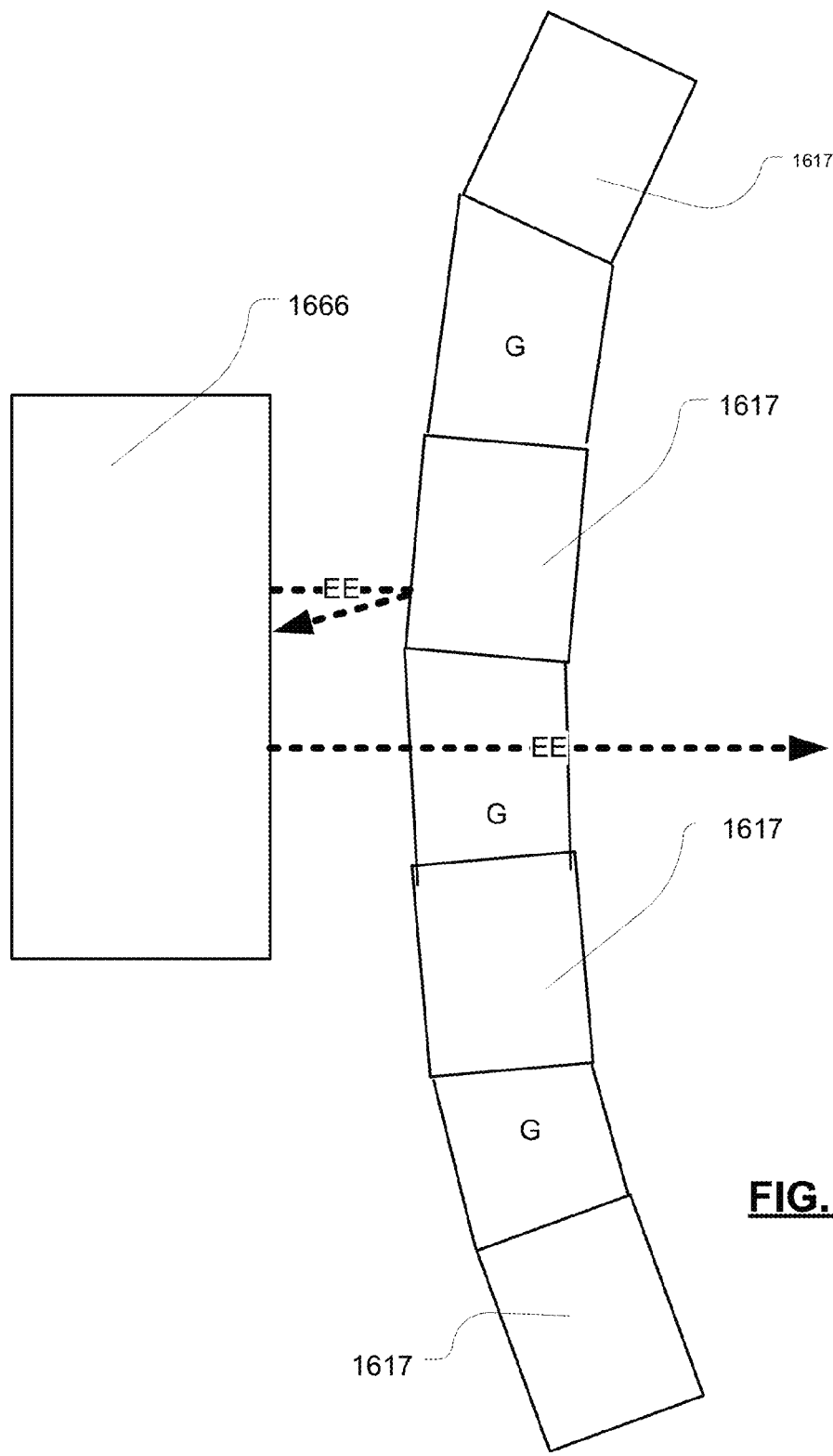
FIG. 17 illustrates a detailed view of an embodiment of a user input consistent with the features of the disclosure.

FIG. 17 illustrates a detailed view of position ring 1616. As can be seen in the figure, incremental protrusions 1617 are separated by gaps G so that as the ring is rotated an sensor 1666 can sense the order in which a plurality of emitted beams of electromagnetic energy EE are reflected by the protrusions 1617 (or allowed to pass through the gaps G) as the user input is rotated. Supporting circuitry may count the incrementally returned energy EE so as to digitize a user's input for use by the computing components of the controller and system.

Figure 18:
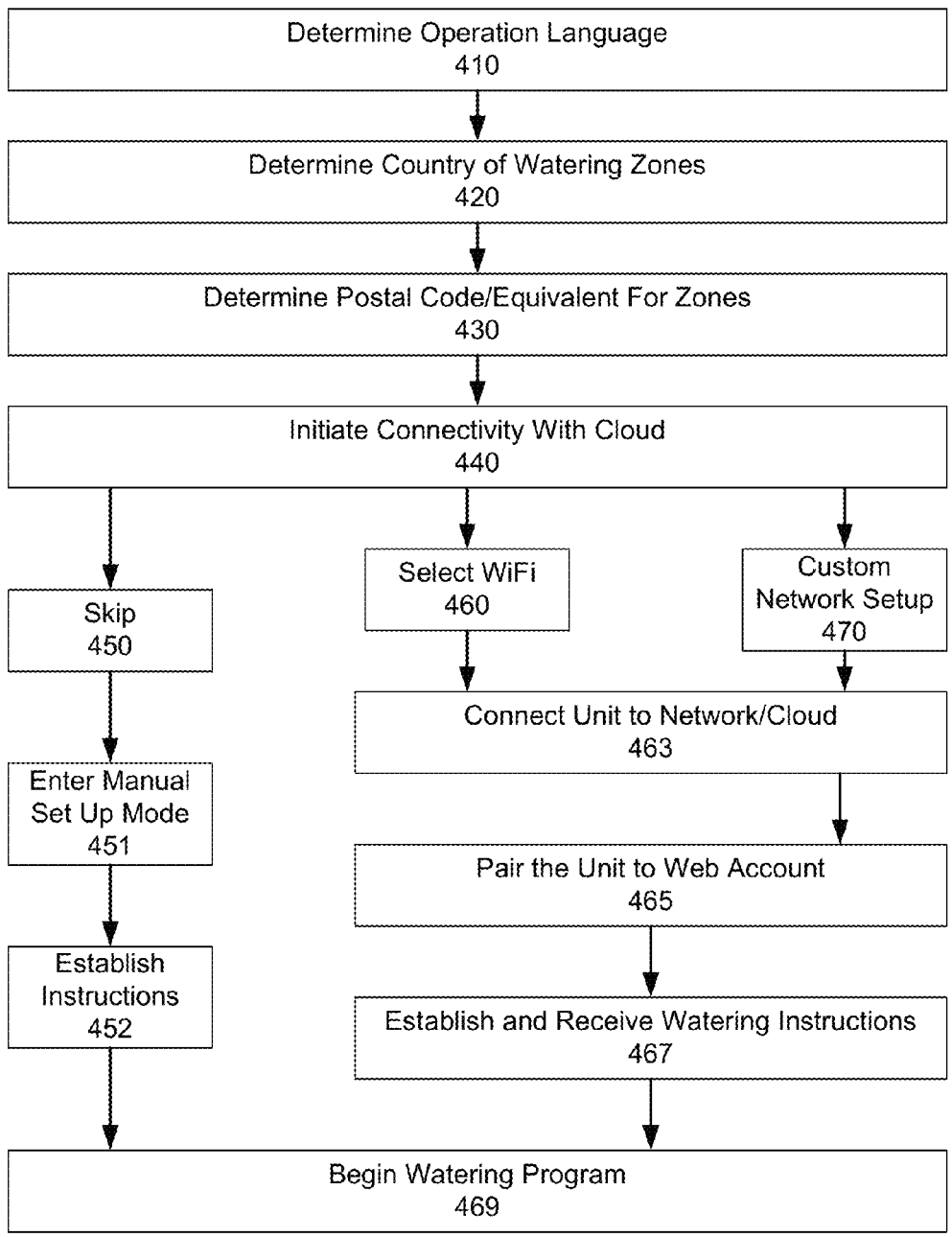
FIG. 18 illustrates an implementation of a method for initializing optimal irrigation in an irrigation system having a controller configured to be connected to an irrigation server over a computer network in accordance with the teachings and principles of the disclosure.

Referring now to FIG. 18, there is illustrated an implementation pairing between a user's control unit and an account, such as a web account. FIG. 18 illustrates, a method for initiation of an irrigation optimization system having the features of the disclosure. The method 400, may initiate at 410 by determining the language the user will use in interacting with the system. The user selection will be recorded into computer memory on the system. At 420, the geo graphical location of the user may then be determined, and at 430 the geographical location may be further refined more specific questions. Once the location has been established, the system may then establish connectivity with a cloud network.

At 450, the network connectivity may be skipped and at 451 a user may be asked to manually set up a watering protocol by responding to questions from the control panel. At 452, a watering protocol of instructions will be generated and at 469 irrigation may begin automatically.

Alternatively, a user may be presented with available Wi-Fi connection options and may choose the desired connection, or at 470 a user may enter custom network settings. Once connected to the network cloud, at 465 the control panel may be paired with an online account previously (or concurrently) set up through a web interface.

At 467, a watering protocol may be generated and transmitted through the cloud to the paired controller, wherein the watering instruction are formulated from user responses to quires output from the system through the web account or through the control panel user interface. At 469, the system may begin the watering protocol that has been received from the cloud network.

Figure 19:
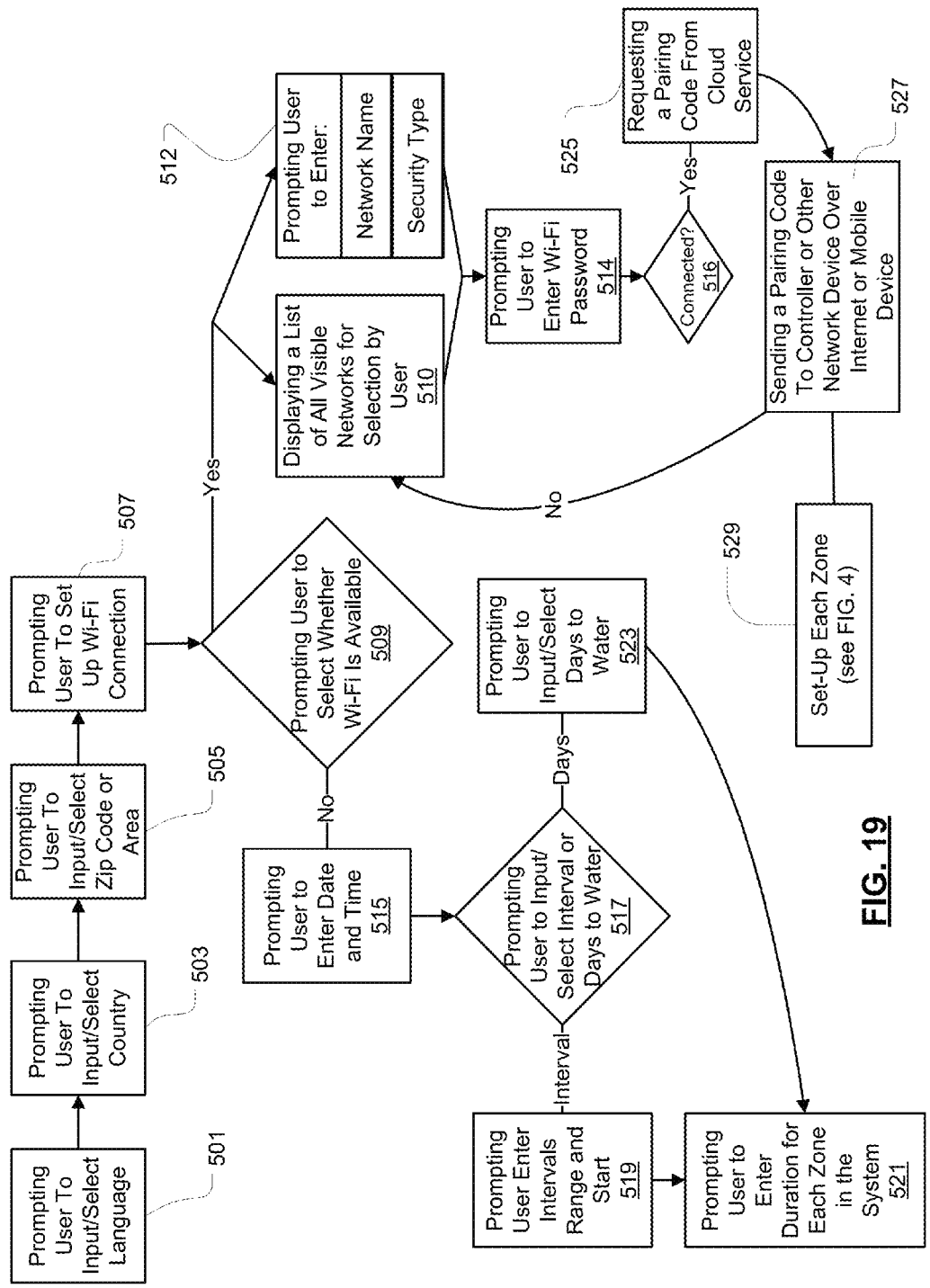
FIG. 19 illustrates an implementation of a method for providing optimal irrigation in an irrigation system having a controller configured to be connected to an irrigation server over a computer network in accordance with the teachings and principles of the disclosure.

FIG. 19 illustrates a method of initiating a smart irrigation system comprising specific logic when initializing a new control panel. After a control panel has been wired to a plurality of control valves, the user/customer may be lead through a series of quires by a control panel interface. In order to initialize the interface and language of communication may be selected at 501. Next at 503 the user may be prompted to select the country in which they and the property to be watered resides, and the user may be prompted for further refinement of location at 505.

At 507, the user may be prompted to set up a connection to a cloud network through a Wi-Fi internet connection. At 509, the user may be prompted to choose whether or not connect to the cloud or run the irrigation system manually from the control panel.

If the user decides not to connect to the internet, at 515 the user will be prompted to enter data in manually, such as data and time. At 517 the user may be prompted to manually select or enter an irrigation interval or days to water. If the user chooses to enter an interval, at 519 the user will be prompted to enter the interval. Alternatively, if the use selects to irrigate according to days, at 521 the user will be prompted to enter the days for irrigation. It should be noted that in an implementation the user may be able to select both irrigation days and irrigation intervals.

At 523, the user will be prompted to enter a duration and/or day for each of the zones controlled by the control panel. At 509, if the user had chosen connect to a network the user would be prompted to select from available networks at 510, or enter security information for a custom network at 512. At 514, the user may be prompted for a password. At 516 if the password fails the user will be redirected to 510 or 512 to retry the network security information. At 516, if connecting to the internet is successful, at 525 a pairing request will be sent to the control panel that will pair a cloud base web account to the control panel. Additionally, at 527 pairing codes may be established for a plurality of computing devices comprising: additional controllers, mobile devices, computers, etc.

Figure 20:
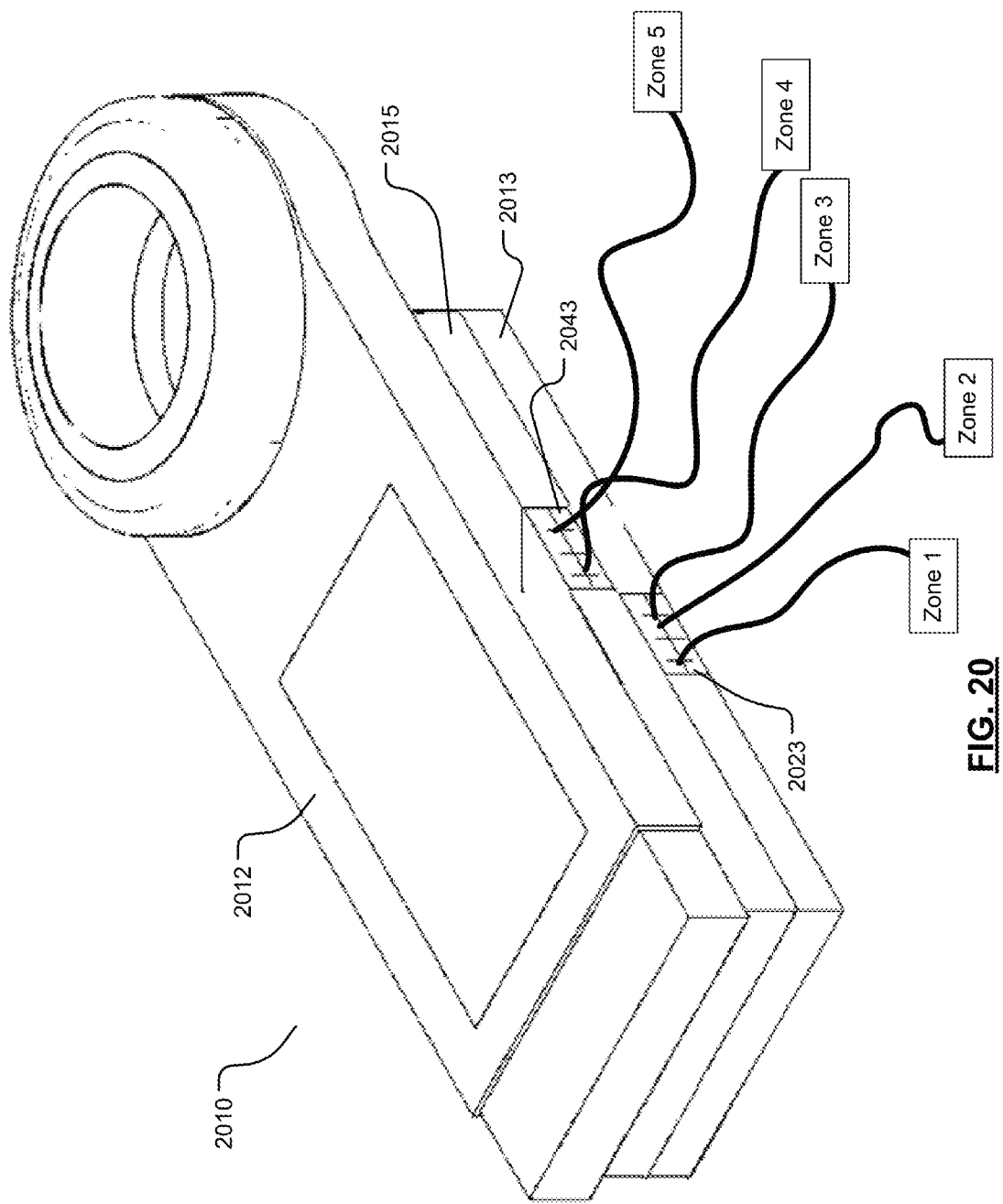
FIG. 20 illustrates an implementation of an irrigation controller with a stacked control unit, expansion module, and irrigation adaptor in accordance with the teachings and principles of the disclosure.

FIG. 20 illustrates an embodiment of an irrigation controller that comprises a stacked control unit 2012, expansion module 2015, and irrigation adaptor 2013. As can be seen in the figure, the expansion module 2015 may provide the additional functionality of controlling more irrigation zones. For example, an irrigation adaptor 2013 may control one or more zones, such as a plurality of irrigation zones. As a specific example illustrated in FIG. 20, the irrigation adaptor 2013 may control irrigation zone 1, zone 2, and zone 3. In order to provide control over one or more additional zones, an expansion module 2015 may be provided that is electronically connected to additional operable irrigation components that irrigate additional zones, which may not be controlled by the irrigation adaptor 2013. In the example illustrated in FIG. 20, the expansion module 2015 controls zone 4 and zone 5. As shown in the figure, wires connecting the irrigation components may physically pass through wire ports 2023 and 2043 disposed in a housing wall of the irrigation adaptor 2013 and expansion module 2015, respectively.

In an embodiment, the expansion module may provide connectivity of additional system components, such as various sensing abilities through the connection of flow sensors, temperature sensors, moister sensors, light sensors, wind sensors and the like.

In an embodiment, the expansion module may provide communication and control functionality such as wireless control of remotely placed irrigation components.

Figure 21:
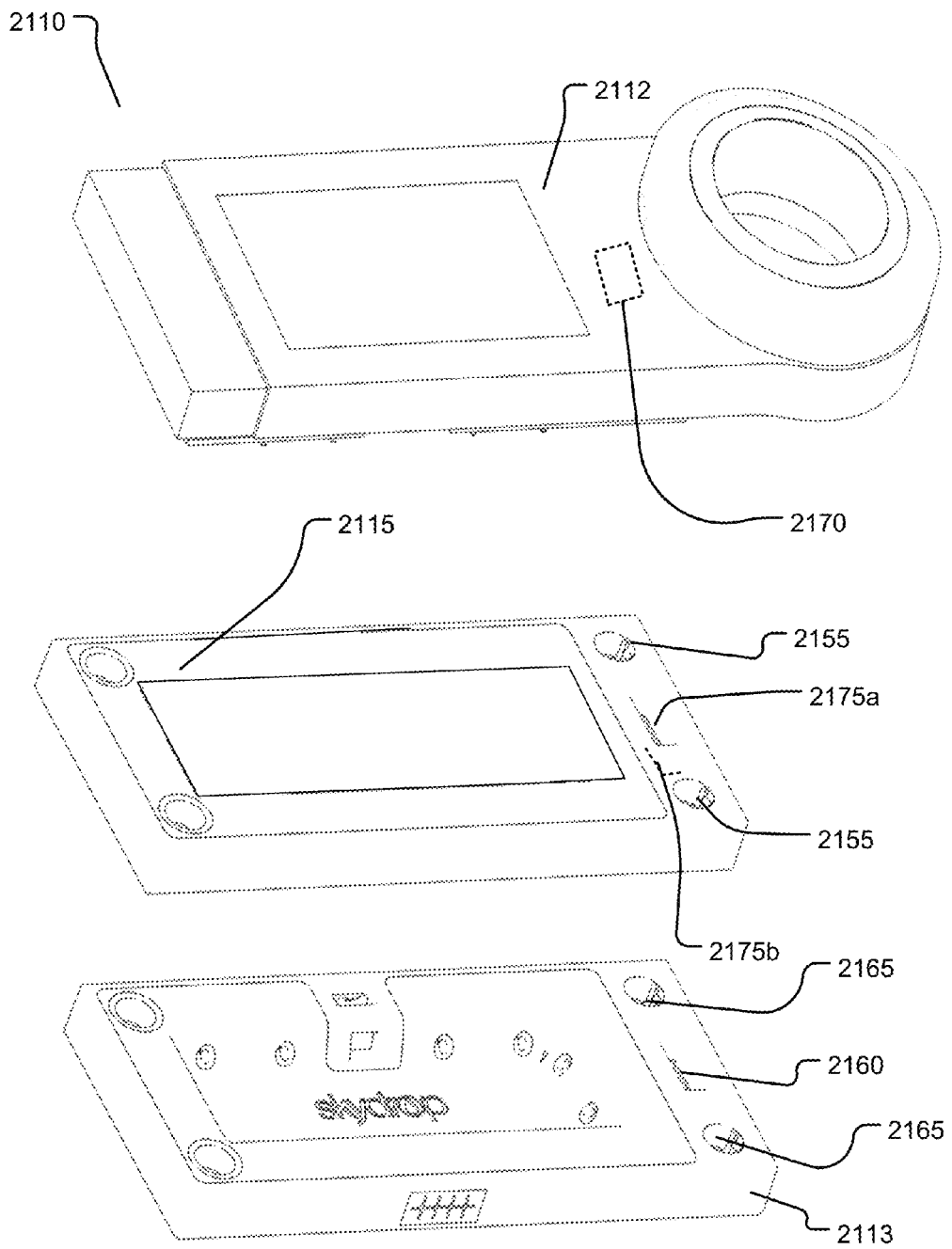
FIG. 21 illustrates an exploded view of an implementation of an irrigation controller with a stacked control unit, expansion module, and irrigation adaptor in accordance with the teachings and principles of the disclosure.

As can be seen in FIG. 21, an embodiment of the expansion module 2115 may comprise attachment structures 2155 that correspond to complimentary attachment structures on the control unit 2112 and adaptor 2113. The attachments may be configured with known or yet to be discovered attachment structures such as protrusions, male-female structures, and common fasteners. For example, the attachment structures may comprise male and female portions that interact and mate mechanically in a detachable manner allowing for expansion and maintenance of the system. Magnets may be used for physically connecting a control unit to an adaptor. Other examples could be all manner of fasteners such as screws, bolts, nails, and the like.

Additionally, in an embodiment the control unit 2112 may be in electronic communication and mechanical communication with the irrigation adaptor 2113 through an expansion module 2115. As can be seen in the figure, the adaptor 2113 may comprise one half of an electronic connector 2160 and the control unit 2112 may comprise a corresponding one half of an electronic connector 2170 (show schematically in phantom lines) that both electronically connect to corresponding electronic connector halves on opposing faces of the expansion module 2115.

In a stacked embodiment, for example, the attachment structures 2155, 2165 may be configured so as to cause the alignment of the first and second halves of the electronic connectors. Connector combinations may include male and female connectors, biased-compression connectors, and friction connector configurations to provide secure electronic communications. For example, the control unit 2112 may comprise a male electronic connector 2170 (as shown in phantom lines) that corresponds with a female electronic connector 2175 of the expansion module 2115. Likewise, the control unit 2112 may be mechanically connected to the expansion module 2115 in order to complete an expanded controller.

Figure 22:
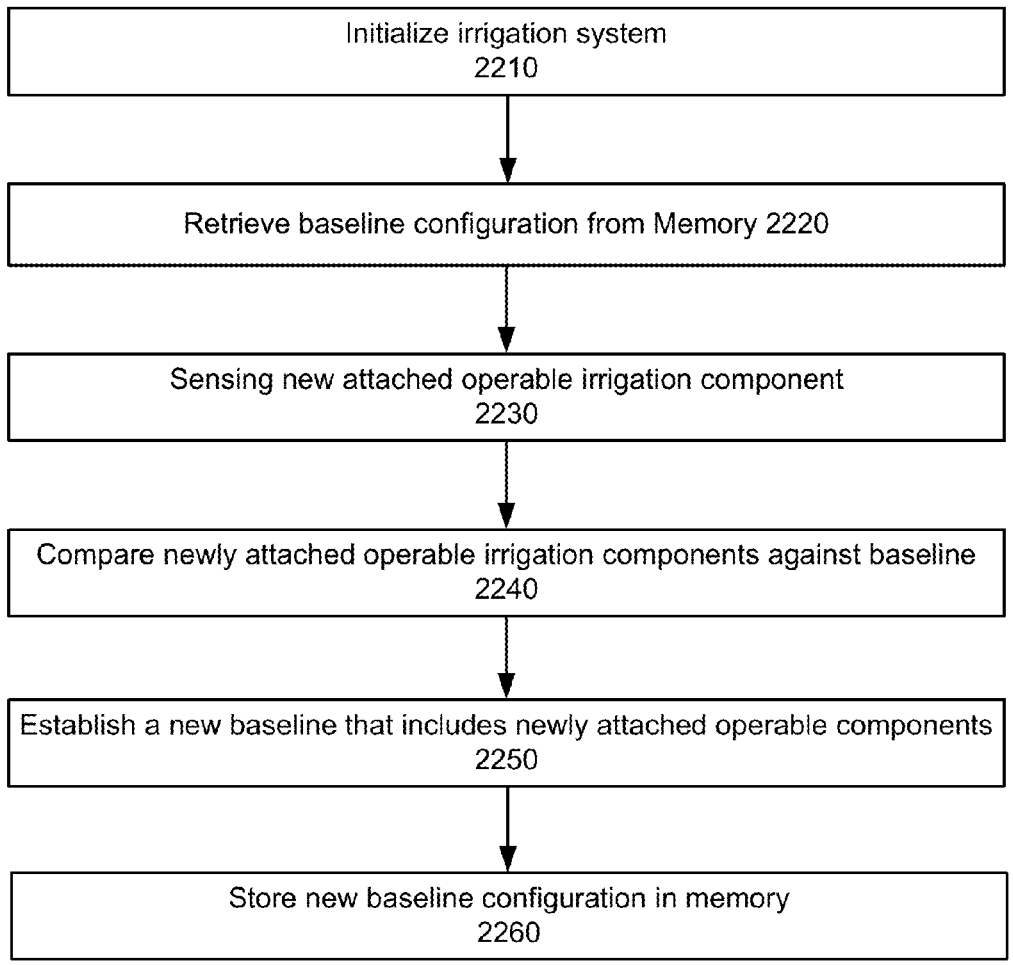
FIG. 22 illustrates a method for developing a protocol for newly added irrigation components that are controllable by a control unit in accordance with the teachings and principles of the disclosure.

FIG. 22 illustrates a method for developing a protocol for newly added irrigation components that are controllable by a control unit. As illustrated in the figure a method for the detection of added operable irrigation components at system start-up may comprise a process of powering on an irrigation system having added operable irrigation components that are in electronic communication with an irrigation controller at 2210. In an implementation, the irrigation controller may be configured for use as a component of a computer network. The irrigation controller may comprise a control unit and an irrigation adaptor. It will be appreciated that the adaptor may be configured to actuate operable irrigation components that operate according to instructions issued from the control unit. Additionally, the method may comprise retrieving a baseline configuration from computer memory at 2220. The baseline configuration may comprise the components that have previously been installed within a system. At 2230, the method may further comprise sensing a new attached operable irrigation component. The sensing process may comprise receiving self-identifying information from the newly installed components or may be derived by sensing various electrical characteristics of the system such as current draw, resistance, inductance, impedance, etc., as electrical current flows through the system.

In an implementation, sensing the current draw may comprise comparing the value of the current draw to an operational threshold/window comparator. If the value of the current draw falls within a predetermined threshold or window then there is an operable component attached to the system and is useable by the system. At that point, the system may go through a setup process described herein above. For example, it will be appreciated that when a current voltage is sent across a sense resistor the result is compared to two other preset voltages that define the thresholds/window of operation. If the value of the current voltage falls outside of the thresholds/window then there is either no new operable component or there is a faulty operable component attached to the system.

At 2240, the method may further include the process of comparing the new, sensed irrigation component to the baseline configuration comprising any previously attached components in order to discover the new components.

At 2250, the method may further comprise establishing a new baseline configuration that includes the newly attached irrigation component. Once the new baseline configuration is established then the new configuration may be stored in memory for later use when adding new components or for performing future iterations as when additional operable components are discovered or installed.

Figure 23:
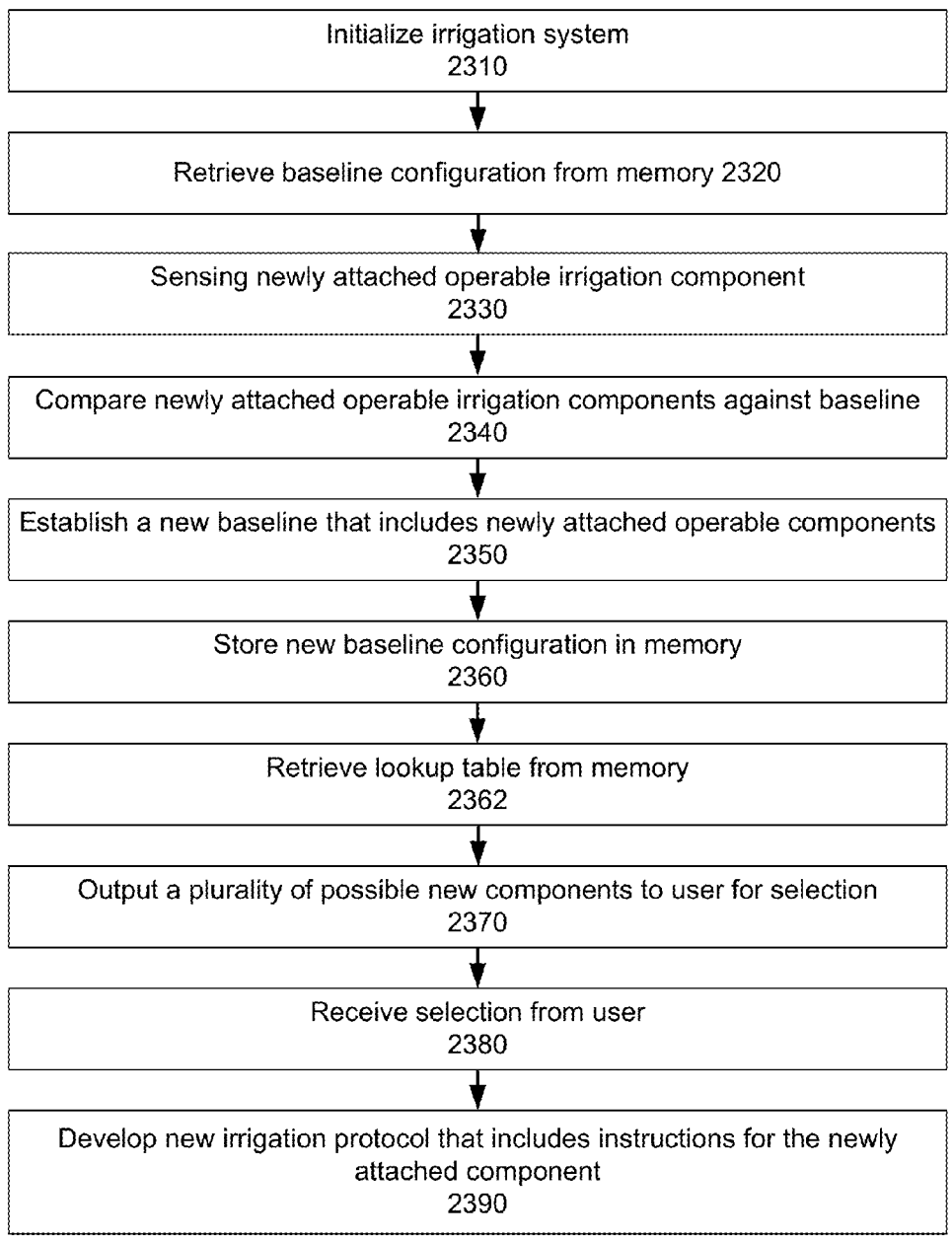
FIG. 23 illustrates a method for developing a protocol for newly added irrigation components using a lookup table and user selection process in accordance with the teachings and principles of the disclosure.

Illustrated in FIG. 23 is a method for developing a protocol for newly added irrigation components using a lookup table and user selection process. As illustrated in the figure, a method for the detection of added operable irrigation components at system startup may comprise a process of powering on an irrigation system having added operable irrigation components that are in electronic communication with an irrigation controller at 2310. In an implementation, the irrigation controller may be configured for use as a component of a computer network. The irrigation controller may comprise a control unit and an irrigation adaptor. The adaptor may be configured to actuate operable irrigation components that operate according to instructions issued from the control unit. Additionally, the method may comprise retrieving a baseline configuration from computer memory at 2320. The baseline configuration may comprise the components that have previously been installed within a system, such as within an irrigation system discussed herein. At 2330, the method may further comprise sensing a new attached operable irrigation component. The sensing process may comprise receiving self-identifying information from the newly installed components or may be derived by sensing various electrical characteristics of the system such as current draw, resistance, inductance, impedance, etc., as electrical current flows through the system.

In an implementation, sensing the current draw may comprise comparing the value of the current draw to an operational threshold/window comparator. If the value of the current draw falls within a predetermined threshold or window then there is an operable component attached to the system and is useable by the system. At that point, the system may go through a setup process described herein above. For example, it will be appreciated that when a current voltage is sent across a sense resistor the result is compared to two other preset voltages that define the thresholds/window of operation. If the value of the current voltage falls outside of the thresholds/window then there is either no new operable component or there is a faulty operable component attached to the system.

At 2340, the method may further include the process of comparing the new sensed irrigation component to a baseline configuration comprising any previously attached components in order to discover the new components.

At 2350, the method may further comprise establishing a new baseline configuration that includes the newly attached irrigation component and then storing the new configuration in memory for later use when adding new components or for performing future iterations as additional operable components are discovered.

At 2360, the method may further comprise storing the new baseline in memory. At 2362, the method may further comprise retrieving a lookup table from memory that comprises data relating to possible operable irrigating components. The lookup table may be periodically downloaded over a network so as to contain updated information. The lookup table may comprise identifying information for components such as identifiers and electrical properties such as current draw, resistance, impedance, etc.

At 2370, a plurality of possible new operable irrigation components is a group may be output to a user so that the user may select the exact component from the list. At 2380, the selection may be received from a user and stored in memory.

At 2390, a protocol may be generated that includes instructions for the new operable component.

Figure 24:
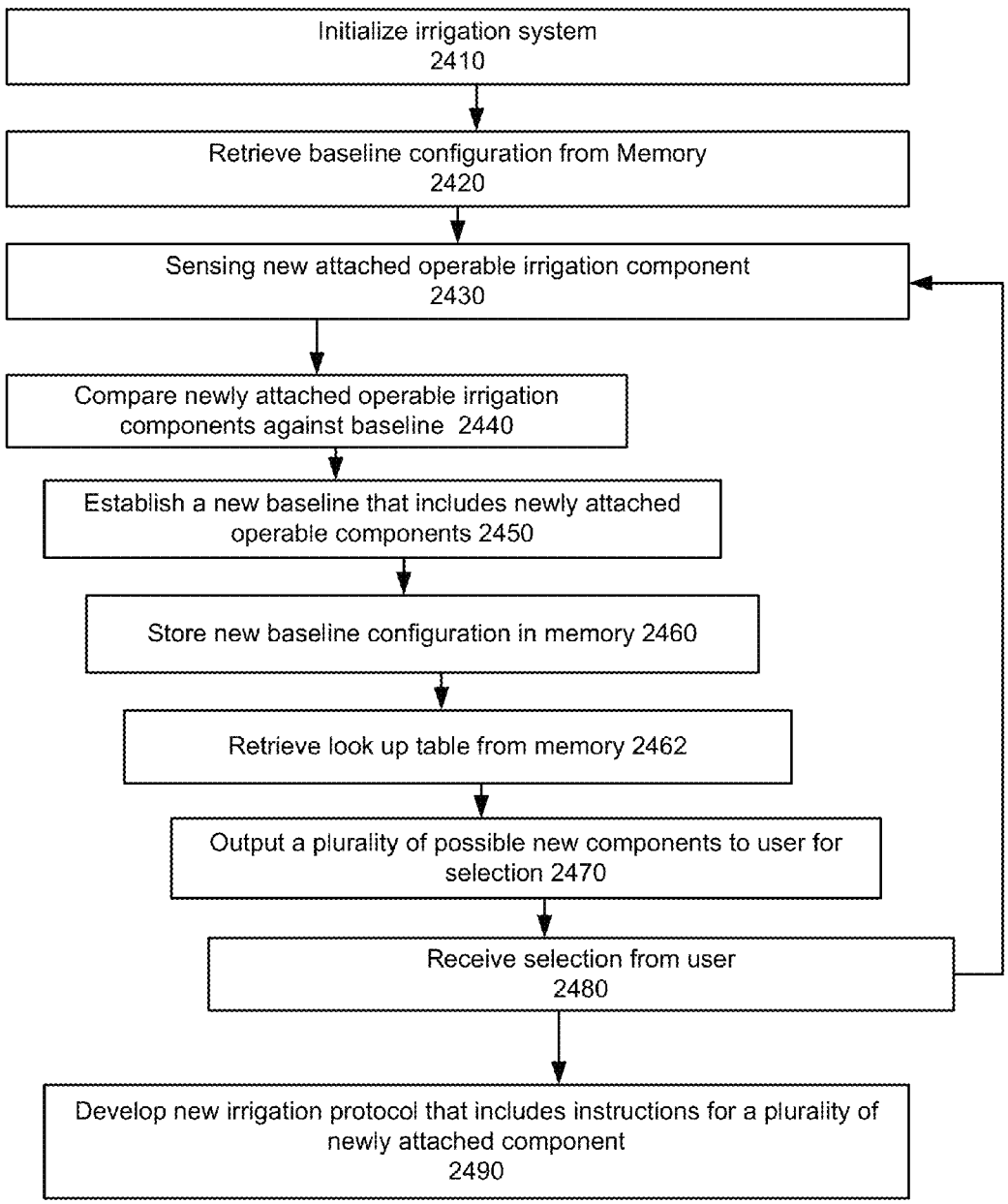
FIG. 24 illustrates a method for developing a protocol for a plurality of newly added irrigation components in succession at startup in accordance with the teachings and principles of the disclosure.

Illustrated in FIG. 24 is a method for developing a protocol for a plurality of newly added irrigation components in succession at the startup of a system. As illustrated in the figure, a method for the detection of added operable irrigation components at system startup may comprise a process of powering on an irrigation system having added operable irrigation components that are in electronic communication with an irrigation controller at 2410. In an implementation, the irrigation controller may be configured for use as a component of a computer network, said irrigation controller comprising a control unit and an irrigation adaptor. The adaptor may be configured to actuate operable irrigation components that operate according to instructions issued from the control unit. Additionally, the method may comprise retrieving a baseline configuration from computer memory at 2420. The baseline configuration may comprise the components that have previously been installed within a system.

At 2430, the method may further comprise sensing a new attached operable irrigation component. The sensing process may comprise receiving self-identifying information from the newly installed components or may be derived by sensing various electrical characteristics of the system such as current draw, resistance, inductance, impedance, etc., as electrical current flows through the system.

If a plurality of new components have been attached or installed to the system, the following may be repeated in sequence until all the newly added components are accounted for as is illustrated in the figure. At 2440, the method may further include the process of comparing the new sensed irrigation component or components to a baseline configuration comprising any previously attached components in order to discover the new component or components.

At 2450, the method may further comprise establishing a new baseline configuration that includes the newly attached irrigation component and then storing the new configuration in memory for later use when adding new components or for performing future iterations as additional operable components are discovered at 2460.

At 2460, the method may further comprise retrieving a lookup table from memory that comprises data relating to possible operable irrigating components. The lookup table may be periodically downloaded over a network so as to contain updated information. The lookup table may comprise identifying information for components such as identifiers and electrical properties such as current draw, resistance, impedance, etc.

In an implementation, sensing the current draw may comprise comparing the value of the current draw to an operational threshold/window comparator. If the value of the current draw falls within a predetermined threshold or window then there is an operable component attached to the system and is useable by the system. At that point, the system may go through a setup process described herein above. For example, it will be appreciated that when a current voltage is sent across a sense resistor the result is compared to two other preset voltages that define the thresholds/window of operation. If the value of the current voltage falls outside of the thresholds/window then there is either no new operable component or there is a faulty operable component attached to the system.

At 2470, a plurality of possible new operable irrigation components may be identified as a group that may be output to a user so that the user may select the exact component from the list. At 2480, the selection may be received from a user and stored in memory.

At 2490, a protocol may be generated that includes instructions for the new operable component or components.

Figure 25:
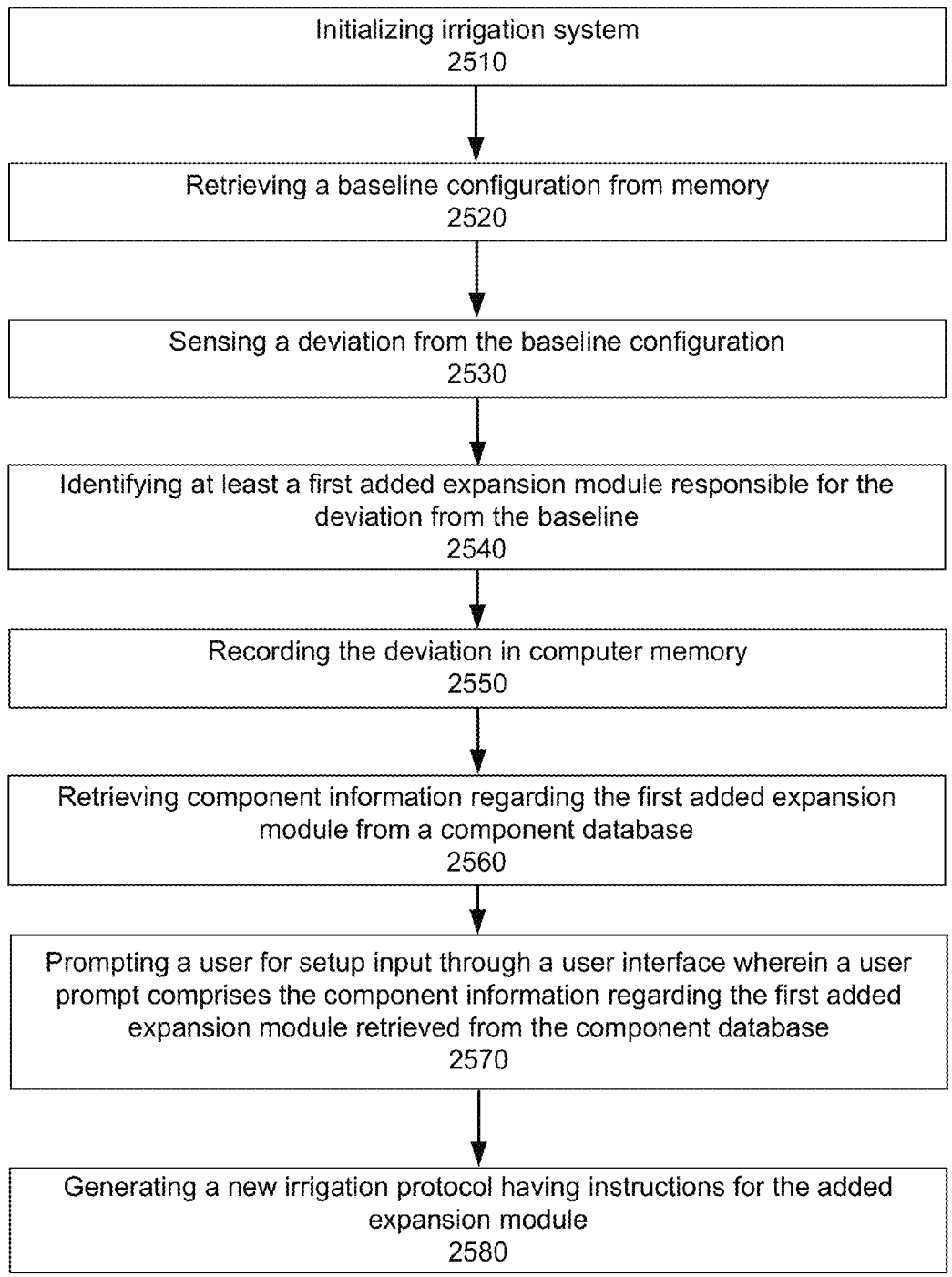
FIG. 25 illustrates an implementation of a method for detecting an expansion module in an irrigation system in accordance with the teachings and principles of the disclosure.

FIG. 25 illustrates an implementation of a method for automatically detecting an expansion module in an irrigation system. The method for the detection of the expansion module in an irrigation system illustrated may comprise powering on or initializing an irrigation system at 2510. The irrigation system may have one or more operable irrigation components. The operable irrigation components may include a sensor, where the operable irrigation components is in electronic communication with an irrigation controller. It will be appreciated that the irrigation controller may be configured for use as a component of a computer network, wherein the irrigation controller receives an operating protocol or an irrigation protocol from the irrigation server over the computer network. The irrigation controller may comprise a control unit and an irrigation adaptor. It will be appreciated that the adaptor may be configured to actuate operable irrigation components that operate according to instructions issued from the control unit. It will be understood that the adaptor may be configured to actuate the operable irrigation components that operate according to instructions issued from the control unit.

The irrigation controller may also comprise an expansion module. The expansion module may be used to expand or add to the functionality of the irrigation controller. The expansion module may be added to the system at any time, whether upon initial setup of the irrigation controller or at a later time when a need arises for additional zones, sensors or the like to be added to the system. It will be appreciated that the expansion module may be configured to be disposed in a stacked configuration.

Continuing to refer to FIG. 25, the method may include retrieving a baseline configuration from computer memory at 2520. At 2530, the method may further include sensing a deviation from the baseline configuration. It will be appreciated that the deviation may be generated by the added expansion module. At 2540, the method may comprise identifying at least a first added expansion module that is responsible for the deviation from the baseline. The deviation may be recorded into computer memory at 2550. At 2560, the method may comprise retrieving component information regarding the first added expansion module from a component database. At 2570, the method may comprise prompting a user for setup input through a user interface. It will be appreciated that a user prompt may comprise the component information regarding the first added expansion module retrieved from the component database. At 2580, the method may comprise generating a new irrigation protocol having instructions for the added expansion module.

In an implementation, the method may further comprise repeating the sensing of the deviation from the baseline configuration for a plurality of additional expansion modules. In an implementation, the baseline configuration is a set of current draw values of a baseline configuration of previously attached operable components, such that the sensing of the first additional expansion module comprises sensing deviation of the baseline configuration for current draw.

In an implementation, the method may comprise retrieving a lookup table from memory and identifying a normal standard of operation of a plurality of additional attached operable components. The normal standard of operation may comprise current usage values.

In an implementation, the method may further comprise suggesting a group of identified added expansion modules for selection by a user through the user interface. In an implementation, the method of generating the irrigation protocol comprises communication with a supporting irrigation protocol server.

It will be appreciated that the expansion module of the disclosure may add additional irrigation zones and functionality of the controller. For example, the expansion module may add support for wireless communication. As another example, the expansion module may add sensor connectivity. It will likewise be understood that the added expansion module, when attached to the system, may self-identify. The sensing process may comprise receiving self-identifying information from the newly installed component or components, such as one or more expansion modules, or may be derived by sensing various electrical characteristics of the system such as current draw, resistance, inductance, impedance, etc., as electrical current flows through the system. The expansion module may comprise terminals configured to interface electrically with the irrigation system. The expansion module and control unit may be configured to be mounted on a substantially vertical surface via the irrigation adaptor. The expansion module may be removably attached to the irrigation adaptor via mechanical fasteners.

It will be appreciated that the user interface may be presented over a computer network as a web interface. In an implementation, the user may be prompted via a mobile device or in an implementation the user may be prompted via a display within the control unit.

The methods of the disclosure may further comprise suggesting a group of identified operable irrigation components, such as one or more expansion modules, that are responsible for the deviation to a user and outputting the group for selection by the user for setup.

A system for the detection of an expansion module in an irrigation system during operation may comprise an irrigation system comprising plumbing and an irrigation controller. The irrigation system may comprise one or more operable irrigation components that are in electronic communication with the irrigation controller. An irrigation server may be connected to the irrigation controller over a computer network. The irrigation controller may receive an operating protocol from the irrigation server over the computer network. The irrigation controller may be configured for use as a component of the computer network.

As discussed herein above, the irrigation controller may comprise a control unit and an irrigation adaptor. The adaptor is configured to actuate the operable irrigation components that operate according to instructions issued from the control unit. The system may further include a sensor that is in electronic communication with the irrigation controller and may also comprise a baseline configuration of the operable irrigation components. The baseline configuration may be stored in computer memory. It will be appreciated that the deviation within the irrigation system may be sensed by the sensor, such that a deviation relative to the baseline configuration of the irrigation system results in the system sending a notification to a user regarding the sensed deviation establishing that an expansion module has been added to the system. It will be appreciated that a measurable increase above or a decrease below the baseline configuration may result in the system sending a notification to a user regarding the sensed deviation establishing either an addition to or deletion of an expansion module from the system, whereas a slight or small fluctuation above or below the baseline configuration may not. It will be appreciated that the deviation from the baseline configuration may be sensed when the expansion module is attached to the system. It will be appreciated that the deviation may be generated by the expansion module.

In an implementation of the system, the operable irrigation components may comprise an identifier, such that the operable irrigation component responsible for the deviation from the baseline configuration is identifiable by the identifier. In an implementation of the system, a signal may be sent to the controller from the sensor when there is a deviation from the baseline configuration, such that the system may alert the user that there is an expansion module either added or removed from the system.

In an implementation of the system, a new irrigation protocol may be generated by the irrigation server to include the newly attached expansion module, which may include one or more zones or new operable components. The new irrigation protocol may be stored in memory of the controller. In an implementation, the new protocol may be generated by the irrigation server or the controller. When the new protocol is generated by the server, there may be electronic or network communication with the irrigation server and the controller in order to send the protocol from the irrigation server to the controller.

In an implementation of the system, the baseline configuration may be a set of standard operating values of a baseline configuration of previously attached operable components. In an implementation of the system, the system may further comprise a lookup table that is retrieved from memory. The lookup table may identify a normal standard of operation of attached operable components. In an implementation of the system, the normal standard of operation comprises standard operating values from a plurality of iterations of operating the irrigation system. In an implementation of the system, the normal standard of operation comprises standard operating values corresponding to a plurality of iterations of operation of individual operable components. In an implementation of the system, a group of identified operable components responsible for the deviation may be suggested and output to a user for selection by the user.

It will be appreciated that a system of providing optimal irrigation in an irrigation system having a controller configured to be connected to an irrigation server over a computer network may comprise a computer network that itself may comprise an irrigation server and a protocol generator. The system may further comprise a controller. It will be appreciated that the controller may be in electronic communication with the plumbing of the irrigation system. The controller may also be in communication with the irrigation server over the computer network. Thus, when a communication connection between the controller and the server is established information and data may be exchanged between the server and the controller. For example, the server may formulate, generate and otherwise develop an irrigation protocol and/or a historical operational backup protocol and may send one or more of those protocols to the controller.

The controller, in return, may generate a transcript or other data relating to an iteration of the irrigation or watering event that may have just occurred. The transcript or other operational data may be sent from the controller to the irrigation server and the cloud or network service.

Additionally, in an implementation data may be stored and written, such as the irrigation protocol, into computer memory of the controller and/or server. The irrigation server may receive data reported back from the controller relating to an iteration of the irrigation protocol that has been executed. The protocol generator may use the reported back data to generate a historical backup protocol. The irrigation server may send the historical backup protocol to the controller wherein the historical backup protocol may be stored or written to the computer memory of the controller. The controller may retrieve the historical backup protocol from memory and may then execute the historical protocol if or when a connection between the irrigation server and the controller is not established.

In an implementation, the controller records irrigation iteration data into computer memory after the irrigation protocol has been executed by the controller. In an implementation, the controller records irrigation iteration data into computer memory until communication between the irrigation server and controller is reestablished. In an implementation, the controller may record irrigation iteration data for a plurality of iterations into computer memory after a plurality of irrigation protocols have been executed by the controller. In an implementation, the controller may record irrigation iteration data into computer memory until communication between the irrigation server and controller is reestablished.

In an implementation, the irrigation server may initiate and receive one or more notifications that may be output from the controller regarding the connection that was not established. In an implementation, the notification may be a visual output from the controller that operates as a visual cue to a user. In an implementation, the notification may be an audible signal output from the controller that operates as an audio cue to a user.

The system and method may generate a first start time that may act as a calendar item to send a follow-up query or notification to the user, for example a week later, to determine whether the user is pleased or otherwise satisfied with the health of the landscape, and if so, the system may reduce the amount of water a second time. The system and method may generate a calendar item to send a follow-up query or notification to the user, for example a week later, to determine whether the user is pleased or otherwise satisfied with the health of the landscape. If the user is satisfied, then the system may maintain the current duration for that zone.

The weather information may include current weather information and may be for a specific location that corresponds with the location of the controller of the plumbing system. The weather information may include data relating to current humidity, current temperature, current solar radiation, and/or current wind speed. The weather information may also provide additional data without departing from the scope of the disclosure.

In an implementation, the irrigation server may aggregate weather data from a single source or from a plurality of sources. In an implementation, the system and method may comprise a user web account, wherein the user web account is paired with the controller. In an implementation, the system may further comprise a notice generator that generates notifications for a user regarding events within the system, wherein the irrigation server transmits the notifications to the user prompting the user to enter data relating to the irrigation system and/or one or more irrigation zones of the irrigation system. In an implementation, the irrigation server may electronically communicate with the user through the web account located on a database and displayed using a general purpose computer, through a mobile device, and/or through the controller to send the notifications to the user.

It will be appreciated that the cloud or network service may perform many of the calculations and generate the irrigation protocols and other instructions that may be sent directly to the controller. Thus, it is the cloud or network service that provides the processing via one or more servers of the data obtained from one or more various aggregated weather sources or databases. In an implementation, the irrigation server may perform various computer implemented steps to utilize the current weather data that is provided at a regular predetermined interval, such as at one hour intervals, and generate the irrigation protocols that may be sent to the controller for actuation of the irrigation or plumbing system.

The irrigation server may electronically communicate with the controller. The irrigation server may also send one or more irrigation protocols to the controller over the computer network where the irrigation protocol is written into computer memory of the controller for execution by the controller. In an implementation, the system and method may utilize a clock that may be configured for providing time stamp data to events within the system. The one or more irrigation protocols may comprise time stamp data. Once the controller has received the one or more irrigation protocols, the controller executes the irrigation protocols to thereby actuate the irrigation or plumbing system.

In an implementation, the system and method the irrigation server may determine a slope of the ground, current temperature, and/or the geographical region type if there is no solar radiation data provided to the protocol generator. In an implementation, the irrigation server determines the slope of the ground, temperature, and/or the geographical region type prior to the protocol generator determining the amount of water needed to replenish the root zone for the given irrigation zone.

In an implementation, the system and method may further comprise initiating a notification to a user's communication device regarding the connection that was not established. In an implementation, the user communication device may be a computing device connected over a network. In an implementation, the network may comprise cellular network functionality. In an implementation, the user communication device may be a mobile device or other communication device capable of receiving notifications from a network. In an implementation, the system and method may further comprise initiating and receiving a notification output from the controller regarding the connection that was not established. It will be appreciated that in an implementation, the notification may be a visual output from the controller. In an implementation, the notification may be an audible signal output from the controller. In an implementation, the system and method may further comprise rechecking for network connectivity between the irrigation server and the controller.

Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

The foregoing description has been presented for the purposes of illustration and description. It is not intended to be exhaustive or to limit the disclosure to the precise form disclosed. Many modifications and variations are possible in light of the above teaching. Further, it should be noted that any or all of the aforementioned alternate implementations may be used in any combination desired to form additional hybrid implementations of the disclosure.

Further, although specific implementations of the disclosure have been described and illustrated, the disclosure is not to be limited to the specific forms or arrangements of parts so described and illustrated. The scope of the disclosure is to be defined by the claims appended hereto, any future claims submitted here and in different applications, and their equivalents.

What is claimed is:

1. A method for detecting an expansion module in an irrigation system comprising:
   powering on an irrigation system having operable irrigation components that are in electronic communication with an irrigation controller;
   wherein the irrigation controller comprises:
      a control unit;
      an added expansion module, wherein the expansion module adds additional functions to the irrigation controller and is configured to be disposed in a stacked configuration; and an irrigation adaptor, wherein the adaptor is configured to actuate the operable irrigation components that operate according to instructions issued from the control unit;

wherein the irrigation controller is configured for use as a component of a computer network;

retrieving a baseline configuration from computer memory;

sensing a deviation from the baseline configuration wherein the deviation is generated by the added expansion module;

identifying at least a first added expansion module responsible for the deviation from the baseline;

retrieving component information regarding the first added expansion module from a component database;

prompting a user for setup input through a user interface wherein a user prompt comprises the component information regarding the first added expansion module retrieved from the component database; and generating a new irrigation protocol having instructions for the added expansion module.

2. The method of claim 1, wherein the control unit comprises:

a housing substantially enclosing a circuit board;

a control unit electronic connector providing electronic communication between the circuit board and the irrigation adaptor;

an electronic display within the housing; and a user input;

wherein the control unit is configured to be stacked onto the irrigation adaptor, such that the control unit electronic connector of the control unit mates with a corresponding electronic connector of the irrigation adaptor.

3. The method of claim 1, wherein the expansion module adds additional irrigation zones.

4. The method of claim 1, wherein the expansion module adds wireless communication.

5. The method of claim 1, wherein the expansion module adds sensor connectivity.

6. The method of claim 1, wherein the expansion module is configured to be disposed between the irrigation adaptor and the control unit to form an expanded controller.

7. The method of claim 1, wherein the method further comprises repeating the sensing deviation from a baseline for a plurality of additional expansion modules.

8. The method of claim 1, wherein sensing the first additional expansion module comprises sensing a current draw.

9. The method of claim 1, wherein the baseline configuration is a set of current draw values of a baseline configuration of previously attached operable components.

10. The method of claim 1, wherein the method further comprises retrieving a lookup table from memory and identifying a normal standard of operation of a plurality of additional attached operable components.

11. The method of claim 10, wherein the normal standard of operation comprises current usage values.

12. The method of claim 1, wherein the method further comprises suggesting a group of identified added expansion modules for selection by a user through the user interface.

13. The method of claim 1, wherein the added expansion module self identifies.

14. The method claim 1, wherein the method of generating the irrigation protocol comprises communication with a supporting irrigation protocol server.

15. The method of claim 1, wherein the user interface is presented over a computer network as a web interface.

16. The method of claim 1, wherein the user is prompted via a mobile device.

17. The method of claim 1, wherein the user is prompted via a display within the control unit.

18. The method of claim 1, wherein the expansion module and control unit are configured to be mounted on a substantially vertical surface via the irrigation adaptor.

19. The method of claim 1, wherein the expansion module is removably attached to the irrigation adaptor via mechanical fasteners.

20. The method of claim 2, wherein the controller further comprises an annular user input configured to interact with a user and the display to receive user input thereby;

wherein the annular user input defines a circular opening that passes through the annular input and the housing; and wherein the annular user input and the circular opening are coaxial such that annular user input rotates about an axis of the circular opening.

21. The method of claim 20, wherein the annular user input comprises an illuminated portion that illuminates the circular opening.

22. The method of claim 1, wherein the expansion module comprises terminals configured to interface electrically with the irrigation system.

23. The method of claim 20, further comprising lighting the annular user input wherein the annular user input comprises:

a light ring comprising a translucent material;

a dial ring having incremental openings therein for digitizing input data;

a float ring for reducing friction within the system; and a diffuser for diffusing light from an illumination source.

24. A system for detecting an expansion module in an irrigation system comprising:

an irrigation system comprising plumbing and an irrigation controller, wherein the irrigation system comprises operable irrigation components that are in electronic communication with the irrigation controller;

an irrigation server connected to the irrigation controller over a computer network, wherein the irrigation controller receives an irrigation protocol from the irrigation server over the computer network, wherein the irrigation controller is configured for use as a component of the computer network;

wherein the irrigation controller comprises:

a control unit;

an expansion module, wherein the expansion module adds additional functions to the irrigation controller and is configured to be disposed in a stacked configuration; and an irrigation adaptor, wherein the adaptor is configured to actuate the operable irrigation components that operate according to instructions issued from the control unit;

wherein the control unit comprises:

a housing substantially enclosing a circuit board;

a control unit electronic connector providing electronic communication between the circuit board and the irrigation adaptor;

an electronic display within the housing; and a user input;

wherein the control unit is configured to be stacked onto the irrigation adaptor, such that the control unit electronic connector of the control unit mates with a corresponding electronic connector of the irrigation adaptor;

a baseline configuration that is stored in computer memory, wherein a deviation from the baseline configuration is sensed when the expansion module is attached to the system, wherein the deviation is generated by the expansion module.

25. The system of claim 24, wherein the expansion module adds additional irrigation zones.

26. The system of claim 24, wherein the expansion module adds wireless communication capability.

27. The system of claim 24, wherein the expansion module adds sensor connectivity.

28. The system of claim 24, wherein the expansion module is configured to be disposed between the irrigation adaptor and the control unit to form an expanded controller.

29. The system of claim 24, wherein the system method further comprises sensing the deviation from the baseline configuration for a plurality of additional expansion modules.

30. The system of claim 24, wherein the system senses a current draw from the expansion module.

31. The system of claim 24, wherein the baseline configuration is a set of current draw values of a baseline configuration of previously attached operable components.

32. The system of claim 24, wherein the system method further comprises a lookup table that is retrieved from memory that identifies a normal standard of operation of a plurality of additional attached operable components.

33. The system of claim 32, wherein the normal standard of operation comprises current usage values.

34. The system of claim 32, wherein the system further comprises a group of identified added expansion modules that is output for selection by a user through the user interface.

35. The system of claim 24, wherein the expansion module self identifies.

36. The system claim 24, wherein the irrigation protocol comprises communication with the irrigation server.

37. The system of claim 24, wherein the user interface is presented over a computer network as a web interface.

38. The system of claim 24, wherein the user is prompted via a mobile device.

39. The system of claim 24, wherein the user is prompted via a display within the control unit.

40. The system of claim 24, wherein the expansion module and control unit are configured to be mounted on a substantially vertical surface via the irrigation adaptor.

41. The system of claim 24, wherein the expansion module is removably attached to the irrigation adaptor via mechanical fasteners.

42. The system of claim 24, wherein the controller further comprises an annular user input configured to interact with a user and the display to receive user input thereby;
wherein the annular user input defines a circular opening that passes through the annular input and the housing; and
wherein the annular user input and the circular opening are coaxial such that annular user input rotates about an axis of the circular opening.

43. The system of claim 42, wherein the annular user input comprises an illuminated portion that illuminates the circular opening.

44. The system of claim 24, wherein the expansion module comprises terminals configured to interface electrically with the irrigation system.

45. The system of claim 42, further comprising lighting the annular user input wherein the annular user input comprises:
a light ring comprising a translucent material;
a dial ring having incremental openings therein for digitizing input data;
a float ring for reducing friction within the system; and
a diffuser for diffusing light from an illumination source.

* * * * *